(12) United States Patent
Miller et al.

(10) Patent No.: US 8,835,747 B2
(45) Date of Patent: *Sep. 16, 2014

(54) COMPONENTS OF A TWO-AXIS TRACKING ASSEMBLY IN A CONCENTRATED PHOTOVOLTAIC SYSTEM

(75) Inventors: Wayne Miller, Los Altos, CA (US); Jerry Dejong, Alameda, CA (US); Victor Ocegueda, Fremont, CA (US); Vayardo Lalo Ruiz, Santa Clara, CA (US); Anthony Wlodarczyk, Fremont, CA (US)

(73) Assignee: Soitec Solar GmbH, Freiburg (DE)

( * ) Notice: Subject to any disclaimer, the term of this patent is extended or adjusted under 35 U.S.C. 154(b) by 239 days.

This patent is subject to a terminal disclaimer.

(21) Appl. No.: 13/227,664

(22) Filed: Sep. 8, 2011

(65) Prior Publication Data

US 2012/0152311 A1 Jun. 21, 2012

Related U.S. Application Data

(60) Provisional application No. 61/424,537, filed on Dec. 17, 2010, provisional application No. 61/424,515, filed on Dec. 17, 2010, provisional application No. 61/424,518, filed on Dec. 17, 2010, provisional application No. 61/424,493, filed on Dec. 17, 2010.

(51) Int. Cl.
*H01L 31/042* (2014.01)
*F24J 2/38* (2014.01)
*B21D 53/06* (2006.01)
*H01L 31/052* (2014.01)
*F24J 2/54* (2006.01)

(52) U.S. Cl.
CPC .............. *H01L 31/052* (2013.01); *F24J 2/5417* (2013.01); *F24J 2002/5437* (2013.01); *F24J 2002/5444* (2013.01); *F24J 2002/5451* (2013.01); *F24J 2002/5468* (2013.01); *F24J 2002/5482* (2013.01)

USPC ........ 136/246; 126/600; 126/605; 29/890.033

(58) Field of Classification Search
CPC ........ F24J 2/5417; F24J 2/5424; F24J 2/5427
USPC ......... 384/275, 296, 295, 428, 442, 444, 548, 384/558, 559, 247, 259, 252, 257, 258, 549, 384/556; 403/1; 126/571, 573, 576, 577, 126/600, 605, 606, 607, 683, 684, 696, 698, 126/700; 52/126.1, 126.7, 126.6, 126.5; 136/246, 248, 251; 29/890.033; 250/203.1, 203.4; 180/205.5, 206.5, 180/212, 240; 464/183, 167, 103, 147, 150, 464/97; 248/130, 131
See application file for complete search history.

(56) References Cited

U.S. PATENT DOCUMENTS 3,957,319 A * 5/1976 Gorski ......................... 384/556
4,086,485 A * 4/1978 Kaplow et al. ............. 250/203.4
(Continued)

FOREIGN PATENT DOCUMENTS

WO WO 2005116534 A2 * 12/2005
WO WO 2008046145 A1 * 4/2008

*Primary Examiner* — Jeffrey T Barton
*Assistant Examiner* — Eric R Smith
(74) *Attorney, Agent, or Firm* — TraskBritt

(57) ABSTRACT

Methods and apparatus are described for a two axis tracking mechanism for a concentrated photovoltaic system. Two or more paddle structures containing multiple CPV modules are installed onto each tilt axle on the common roll axle as part of the two-axis tracking mechanism's solar array. The two or more paddle structures couple across the common roll axle on that tilt axle. The common roll axle and each paddle assembly are manufactured in simple modular sections that assemble easily in the field while maintaining the alignment of the tracker assembly.

18 Claims, 18 Drawing Sheets

(56) References Cited

U.S. PATENT DOCUMENTS

| | | |
|---|---|---|
| 4,266,660 A | 5/1981 | Herman |
| 4,751,835 A * | 6/1988 | Galaniuk et al. ............... 72/62 |
| 5,228,644 A * | 7/1993 | Garriott et al. ............ 244/172.6 |
| 5,299,842 A * | 4/1994 | Marks et al. ................. 285/325 |
| 5,660,644 A * | 8/1997 | Clemens ...................... 136/245 |
| 7,465,099 B2 * | 12/2008 | Connell et al. ............... 384/275 |
| 7,968,791 B2 * | 6/2011 | Do et al. ...................... 136/246 |
| 2008/0264467 A1 * | 10/2008 | Doko ............................ 136/245 |
| 2008/0308091 A1 * | 12/2008 | Corio ........................... 126/606 |
| 2009/0114211 A1 * | 5/2009 | Homyk et al. ............... 126/578 |
| 2009/0214149 A1 | 8/2009 | Hoppert |
| 2010/0101630 A1 * | 4/2010 | Kats et al. .................... 136/246 |
| 2010/0252030 A1 | 10/2010 | Marcotte et al. |
| 2011/0041834 A1 * | 2/2011 | Liao ............................. 126/605 |

\* cited by examiner

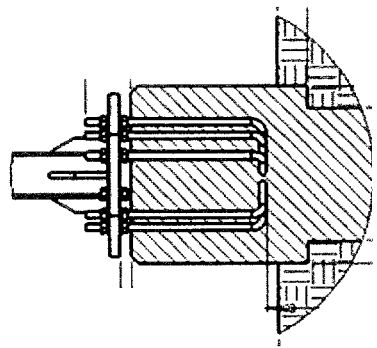
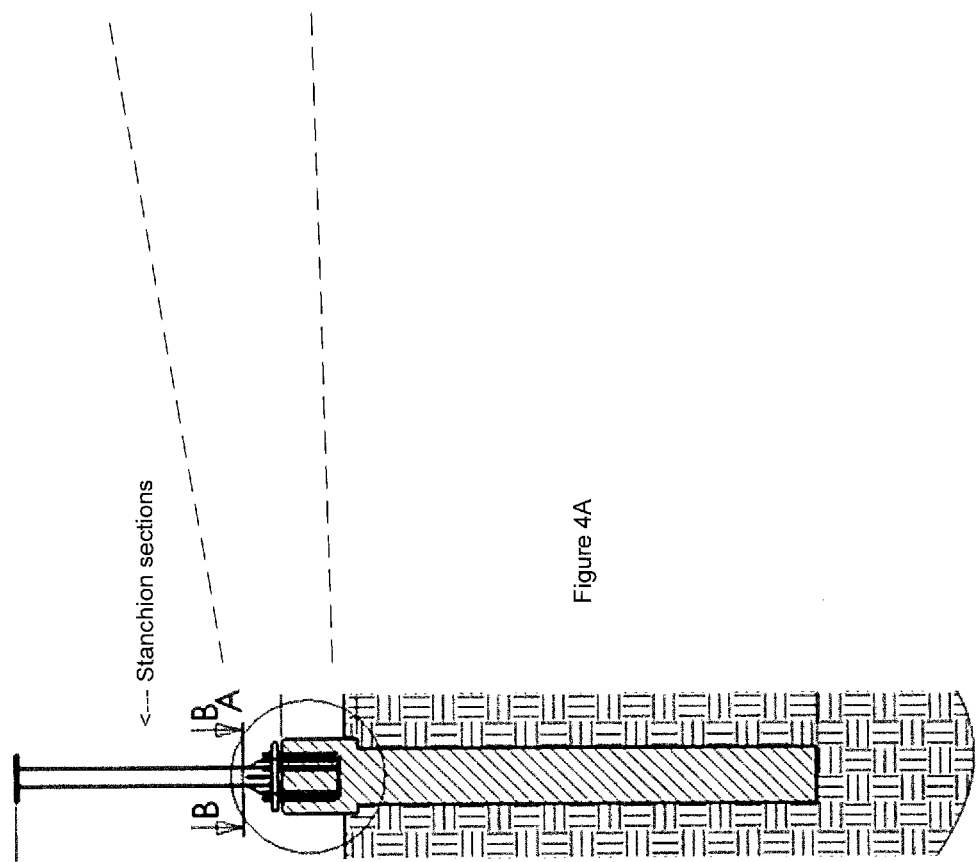
Figure 4B
Figure 4A
<-- Stanchion sections

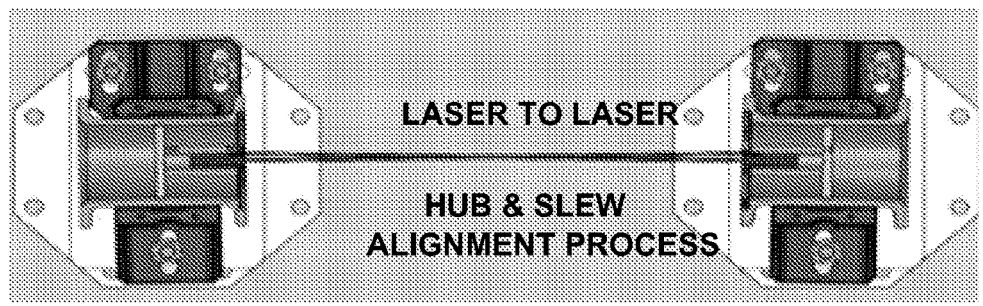
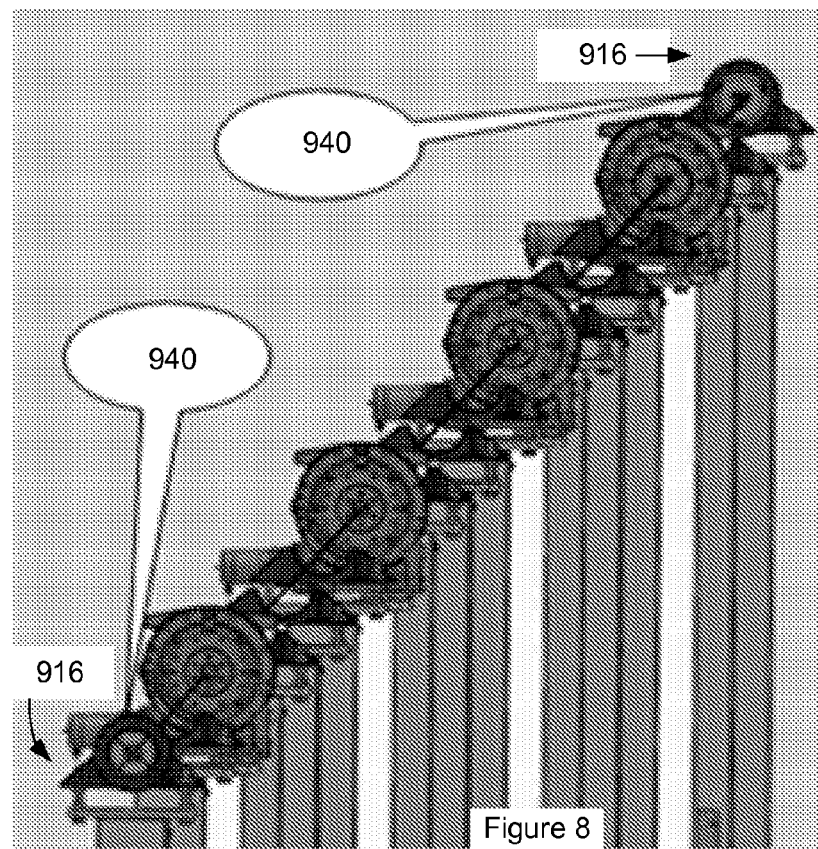
Figure 8

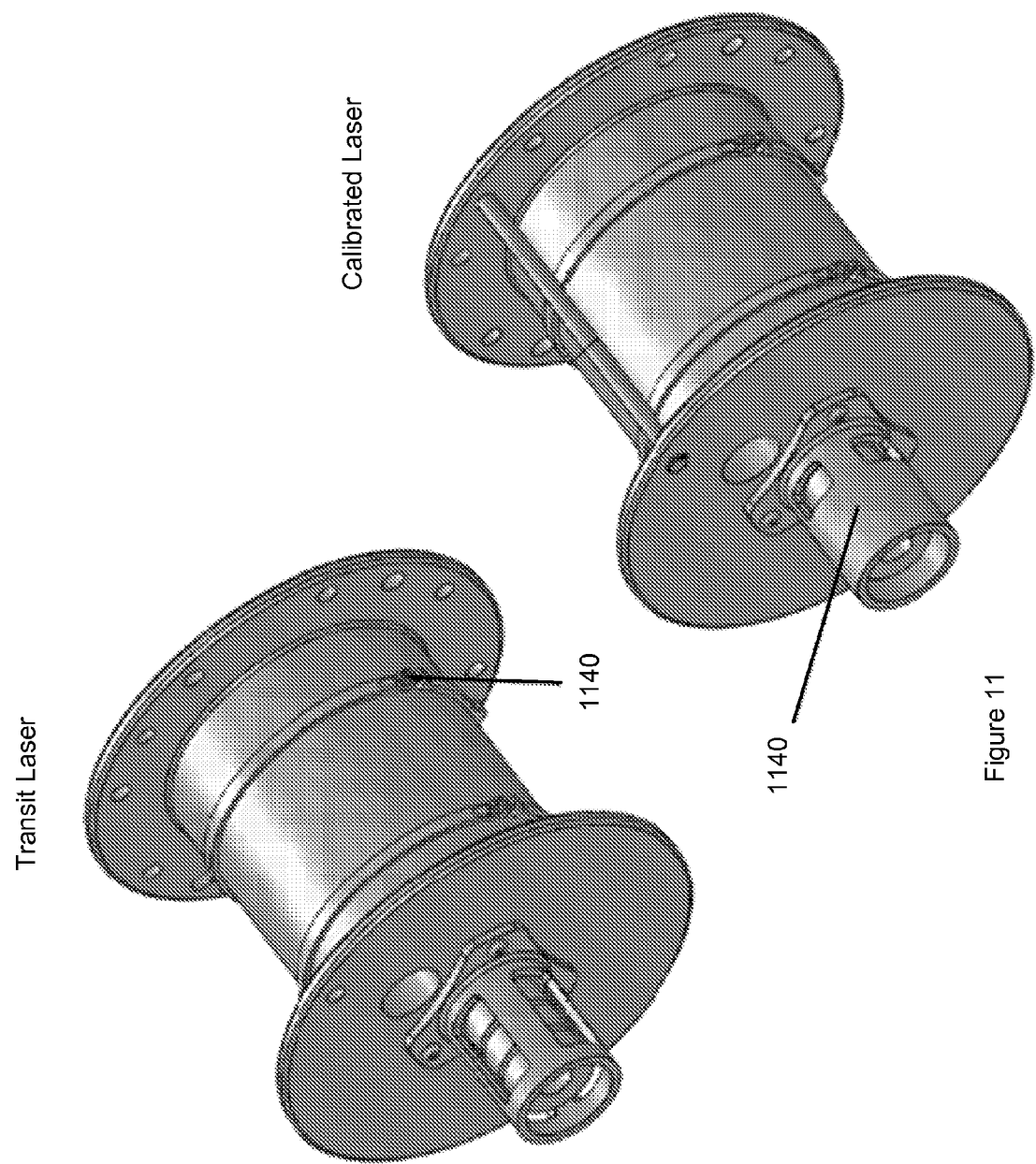

COMPONENTS OF A TWO-AXIS TRACKING ASSEMBLY IN A CONCENTRATED PHOTOVOLTAIC SYSTEM

RELATED APPLICATIONS

This application claims the benefit of and priority to U.S. Provisional Application titled "Integrated electronics system" filed on Dec. 17, 2010 having application Ser. No. 61/424,537, U.S. Provisional Application titled "Two axis tracker parts assembly and tracker calibration" filed on Dec. 17, 2010 having application Ser. No. 61/424,515, U.S. Provisional Application titled "PV cells and paddles" filed on Dec. 17, 2010 having application Ser. No. 61/424,518 and U.S. Provisional Application titled "ISIS and WIFI," filed on Dec. 17, 2010, having application Ser. No. 61/424,493.

NOTICE OF COPYRIGHT

A portion of the disclosure of this patent document contains material that is subject to copyright protection. The copyright owner has no objection to the facsimile reproduction by anyone of the interconnect as it appears in the Patent and Trademark Office Patent file or records, but otherwise reserves all copyright rights whatsoever.

FIELD

In general, a photovoltaic system having a two-axis tracker assembly for a photovoltaic system is discussed.

BACKGROUND

A two-axis tracker may break up its solar array for more efficient operation. A two axis tracker may be designed for easier installation in the field.

SUMMARY

Various methods and apparatus are described for a photovoltaic system. In an embodiment, the two-axis tracker mechanism has multiple parts manufactured in simple modular sections that assemble easily in the field while maintaining the alignment of the tracker assembly. A common roll axle may be composed of multiple segments of roll axle, each with a perpendicular tilt axle. Each tilt axle on the common roll axle may have two or more paddle structures containing multiple CPV modules as part of the two-axis tracking mechanism's solar array. Each paddle assembly is pre-aligned by holes, brackets, or molded connection points, and any combination of these three, in a hinged curved bracket manufactured on each paddle structure in the paddle assembly for a correct coupling and positioning between the two or more paddle structures coupled across the common roll axle on that tilt axle. The common roll axle and each paddle assembly are manufactured in simple modular sections that assemble easily in the field while maintaining the alignment of the tracker assembly.

BRIEF DESCRIPTION OF THE DRAWINGS

The multiple drawings refer to the embodiments of the invention.

FIGS. 4a and 4b illustrate a diagram of an embodiment of a stanchion that has two or more segments including 1) a concrete pillar portion with a capped bolt pattern portion above ground and a portion buried under the ground, and 2) a metal post section.

FIG. 8 illustrates an embodiment of an assembly of portions of the support structure of each tracker mechanism and then aligning the support structure of two or more tracker mechanisms in stages.

FIG. 11 illustrates an embodiment of a transit laser and a calibrated laser.

Figure 1A:
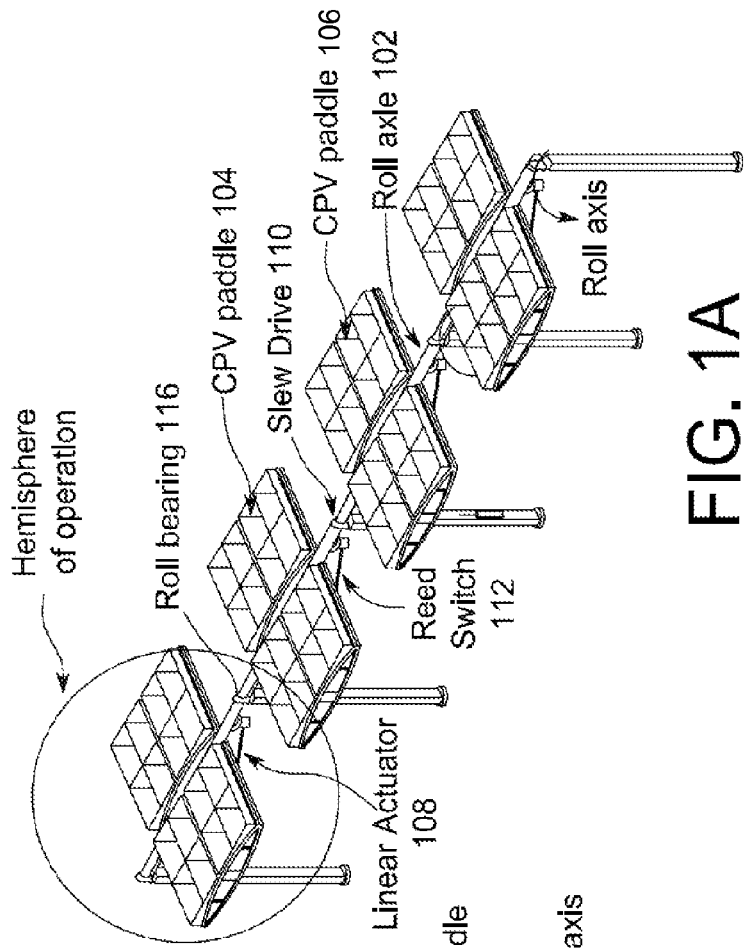
FIGS. 1A and 1B illustrate diagrams of an embodiment of a two-axis tracking mechanism for a concentrated photovoltaic system having multiple independently movable sets of concentrated photovoltaic (CPV) solar cells on a common roll axle and support structure.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific cells, named components, connections, types of connections, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Further specific numeric references such as a first paddle, may be made. However, the specific numeric reference should not be interpreted as a literal sequential order but rather interpreted that the first paddle is different than a second paddle. Thus, the specific details set forth are merely exemplary. The specific details may be varied from and still be contemplated to be within the spirit and scope of the present invention.

In general, various methods and apparatus are discussed for a photovoltaic system. In an embodiment, a solar array of the two axis tracking mechanism is structurally broken up to have multiple independently movable sets of concentrated photovoltaic solar (CPV) cells. In addition, the remainder of the two-axis tracker assembly is also manufactured in simple modular sections that assemble easily in the field while maintaining the alignment of the tracker assembly. A common roll axle may be composed of multiple segments of conical roll axle. Each segment of conical roll axle couples to a perpendicular tilt axle. Each tilt axle on the common roll axle has two or more paddle structures containing multiple CPV cells as part of the two-axis tracking mechanism's solar array. Each paddle assembly is pre-aligned by holes, brackets, or molded connection points, and any combination of these three in a hinged curved bracket manufactured on each paddle structure in the paddle assembly for a correct coupling and positioning between the two or more paddle structures coupled across the common roll axle on that tilt axle. The modular design includes two or more roll bearings, one or more slew drives, and three or more stanchions, all shared/part of a single two-axis tracker mechanism.

As discussed, the field installation and component alignment process for each two-axis tracking mechanism may be a multiple step, such as seven steps, process. In Step 1, the CPV solar cells in an individual CPV module are aligned in three dimensions with each other, and then the aggregate alignment of all of the CPV solar cells in the paddle structure is aligned and checked during the fabrication process. In Step 2, the field installation and coarse alignment of the components forming the support structure of the two-axis tracking mechanism occurs. In Step 3, the fine tuning alignment of the components forming the support structure of the two-axis tracker mechanism via using one or more lasers occurs. In Step 4, installing and aligning segments of the common roll axle onto the support structure of the two-axis tracker mechanism occurs and a coupling of those segments to two or more components making up the support structure of the two-axis tracker mechanism. In Step 5, installing and aligning of the sets of CPV solar cells that have been previously pre-aligned with respect to each other onto the multiple tilt axles of the tracker mechanism occurs. In Step 6, optionally, aiming the one or more laser(s) through the fully assembled two-axis tracker mechanism with the paddle assemblies installed and aligned to recheck and verify the alignment of the two-axis tracker mechanism. In Step 7, optionally, a creation of virtual coordinates for the drive mechanisms moving the physically aligned CPV solar cells occurs.

Figure 1B:
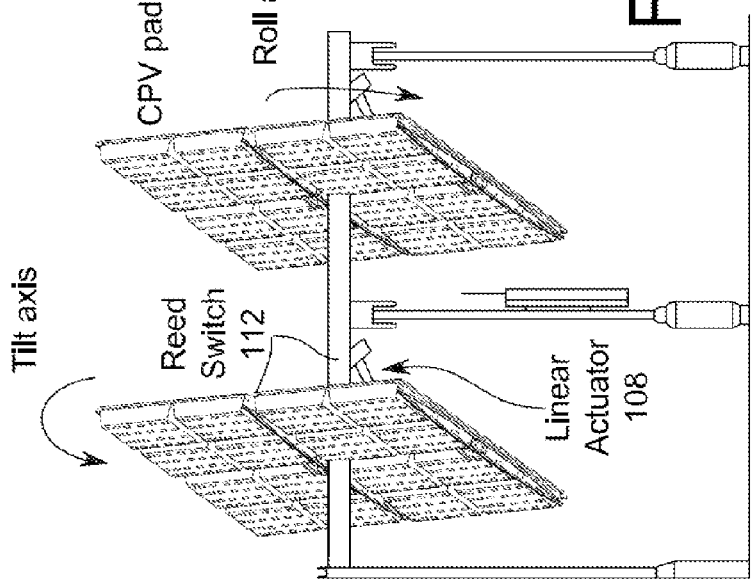

FIGS. 1A and 1B illustrate diagrams of an embodiment of a two-axis tracking mechanism for a concentrated photovoltaic system having multiple independently movable sets of concentrated photovoltaic solar (CPV) cells on a common roll axle and support structure. FIG. 1A shows the multiple paddle assemblies containing the CPV cells, such as four paddle assemblies, at a horizontal position with respect to the common roll axle. FIG. 1B shows the paddle assemblies containing the CPV cells tilted up vertically by the linear actuators with respect to the common roll axle.

The common roll axle 102 is located on three or more stanchions and mechanically rotates the multiple CPV paddle assemblies. Each of the multiple paddle assemblies, such as a first paddle assembly 104, contains its own set of the CPV solar cells contained within that CPV paddle assembly that is independently movable from other sets of CPV cells, such as those in the second paddle assembly 106, on that two-axis tracking mechanism. Each paddle assembly is independently moveable on its own tilt axis and has its own drive mechanism for that tilt axle and can be composed of two or more individual paddles. The drive mechanism may be a linear actuator with a brushed DC motor. An example number of twenty-four CPV cells may exist per module, with eight modules per CPV paddle, two CPV paddles per paddle assembly, a paddle assembly per tilt axis, and four independently-controlled tilt axes per common roll axis.

Each paddle pair assembly has its own tilt axis linear actuator, such as a first linear actuator 108, for its drive mechanism to allow independent movement and optimization of that paddle pair with respect to other paddle pairs in the two-axis tracker mechanism. Each tilt-axle pivots perpendicular to the common roll axle 102. The common roll axle 102 includes two or more sections of roll axle that couple to the slew drive motor 110 and then the roll axle couples with a roll bearing assembly 116 having pin holes for maintaining the roll axis alignment of the solar two-axis tracker mechanism at the other ends, to form a common roll axle 102. The slew drive motor 110 and roll bearing assemblies 116 are supported directly on the stanchions. A motor control board in the integrated electronics housing on the solar tracker causes the linear tilt actuators 108 and slew drive motor 110 to combine to move each paddle assembly and its CPV cells within to any angle in that paddle assembly's hemisphere of operation. Each paddle assembly rotates on its own tilt axis and the paddle assemblies all rotate together in the roll axis on the common roll axle 102.

The tracker circuitry uses primarily the Sun's angle in the sky relative to that solar array to move the angle of the paddles to the proper position to achieve maximum irradiance. A hybrid algorithm determines the known location of the Sun relative to that solar array via parameters including time of the day, geographical location, and time of the year supplied from a local GPS unit on the tracker, or other similar source. The two-axis tracker tracks the Sun based on the continuous latitude and longitude feed from the GPS and a continuous time and date feed. The hybrid algorithm can also make fine tune adjustments of the positioning of the modules in the paddles by periodically analyzing the power (I-V) curves coming out of the electrical power output circuits to maximize the power coming out of that solar tracker.

The hybrid solar tracking algorithm supplies guidance to the motor control board for the slew drive and tilt actuators to control the movement of the two-axis solar tracker mechanism. The hybrid solar tracking algorithm uses both 1) an Ephemeris calculation and 2) an offset value from a matrix to determine the angular coordinates for the CPV cells contained in the two-axis solar tracker mechanism to be moved to in order to achieve a highest power out of the CPV cells. The motion control circuit is configured to move the CPV cells to the determined angular coordinates resulting from the offset value being applied to the results of the Ephemeris calculation.

Note, optimally tracking the Sun with four independently moveable paddle pair assemblies on a solar array is easier and more accurate across the four paddle pair assemblies than with a single large array occupying approximately the same amount of area as the four arrays. In an example, four or more paddles, each contains a set of CPV cells, and form a part of the two-axis solar tracker mechanism. Each of these paddles may be part of a paddle pair assembly that rotates on its own tilt axis. For example, both a first paddle structure containing CPV cells on a first section of a first tilt axle and a second paddle structure containing CPV cells on a second section of the first tilt axle rotate on the axis of that first tilt axle. Likewise, both a third paddle structure containing CPV cells on a first section of a second tilt axle and a fourth paddle structure containing CPV cells on a second section of the second tilt axle rotate on the axis of that second tilt axle, and likewise for all four tilt axles. In addition, the first through fourth tilt axles connect perpendicular to the common roll axle that universally rotates all of the tilt axles. In an embodiment, each two-axis tracking mechanism has CPV cells in the four paddle pairs on a given tracker that can rotate in a total of five axes, the common roll axis and the four linear actuators driving their own paddle pair assembly along its tilt axis.

A set of magnetic reed sensors can be used to determine reference position for tilt linear actuators to control the tilt axis as well as the slew motor to control the roll axis on the common roll axle 102. Each tilt linear actuator may have its own magnetic reed switch sensor, such as a first magnetic reed sensor 112. For the tilt reference reed sensor, on for example the south side of each paddle pair and on the east side of the roll beam, a tilt sensor mount and tilt sensor switch is installed in the holes provided on the roll beam past the end of the paddle. Also, on the paddle assembly, the magnet mount and magnet are screwed in.

An integrated electronics system housing installed on the tracker may include motion control circuits, inverters, ground fault circuits, etc., and act as a local system control point for that solar array.

The paddle structure has only a few components that need to be assembled to install and secure in place on the tracker assembly at the site. The four tilt axles and the continuous roll axle in the common roll axle are supported by five stanchions, and have the one integrated electronics system to control that tracker assembly. The stanchions support the tracker assembly and are shared between CPV paddle pairs. At the shared and non-shared stanchions, the ends of the conical roll axle couple, for support, into the roll bearings. Each paddle pair has its own section of roll beam and own tilt axle. Each paddle pair has its own tilt axis linear actuator to allow independent movement and optimization of that paddle pair with respect to other paddle pairs in the tracker assembly. The tilt actuators and the slew drive motor control the position of the tilt and roll angles of the paddles to orient the CPV cells such that the maximum incoming light is focused to the photovoltaic collectors/receivers in the paddle pair.

Figure 2:
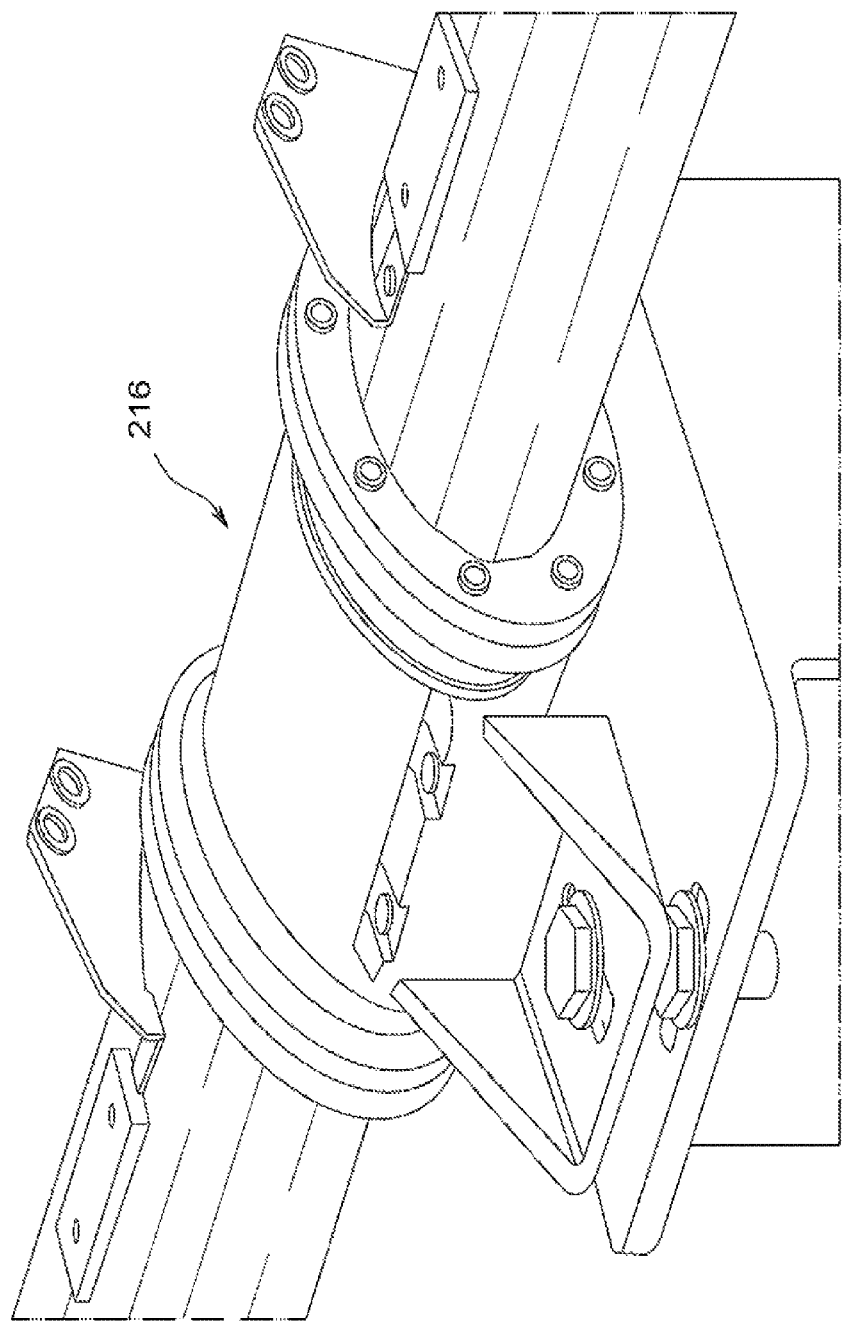
FIG. 2 illustrates a diagram of an embodiment of a roll bearing assembly with pinholes.

FIG. 2 illustrates a diagram of an embodiment of a roll bearing assembly with pinholes. Each roll bearing 216 couples between the narrower ends of the conical roll axle from the two-axis tracker. The roll bearing assembly 216 with pinholes maintains the roll axis alignment of the solar tracking mechanism between neighboring independently moveable CPV paddle pairs. Each roll bearing couples and pins between a pair of stanchions. Each roll bearing assembly 216 may have flanged connection points for assisting in alignment and ease of installation in the field. The two-axis tracker has a slew drive and two or more roll bearings, which couple and pin with the sections of the roll axle to form the common roll axle. The roll bearings align and support the rotation of the common roll axle sections of each tracker.

A spindle for the roll axle may connect into a bottom half of the roll bearing 216. While in this position, the roll beam and the flanges are aligned using the indexing pins on the plate, and are mated together.

Figure 3:
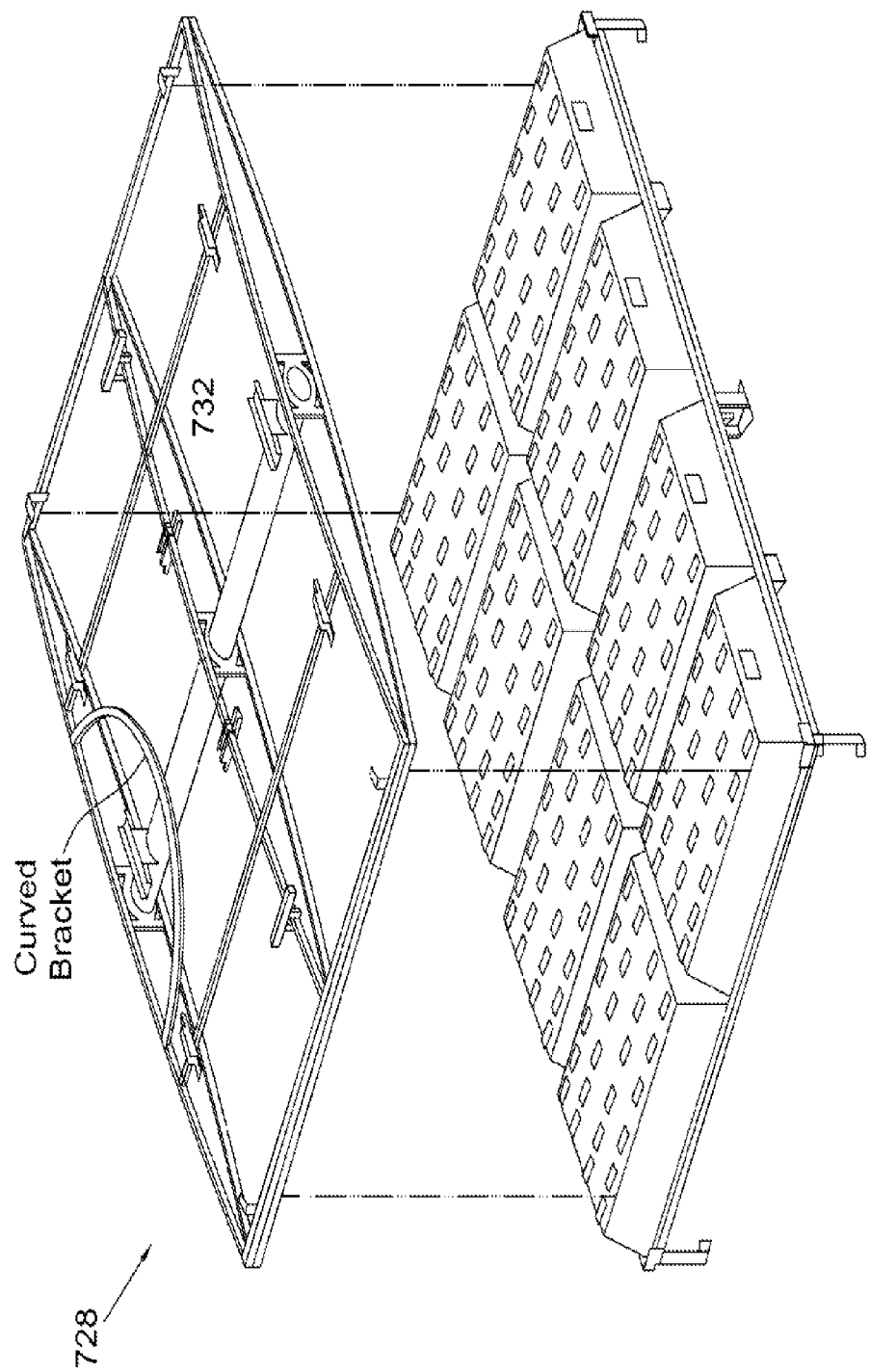
FIG. 3 illustrates an exploded diagram of an embodiment of a paddle structure with its skeletal frame and the CPV modules, each CPV module has multiple CPV cells housed inside.

FIG. 3 illustrates an exploded diagram of an embodiment of a paddle structure with its skeletal frame and the CPV modules, each CPV module has multiple CPV cells housed inside. The CPV modules are installed and housed in the skeletal frame. As discussed, the field installation and component alignment process for each two-axis tracking mechanism may be a multiple step, such as seven steps, process.

In Step 1, the CPV Solar Cells in an Individual CPV Module are Aligned in Three Dimensions with Each Other, and then the Aggregate Alignment of all of the CPV Solar Cells in all of the Modules Contained in the Paddle Structure are Aligned and Checked During the Fabrication Process.

In an embodiment, the setting and maintaining of the three dimensional alignment of the CPV cells with respect to each other and then within the paddle is a several step process. First, the CPV solar cells in an individual module are aligned in three dimensions with each other during the fabrication process. The CPV cells in an individual module are aligned in three dimensions with each other by the fabrication process, and use keyed parts shaped and/or pinning to fit the CPV solar cell together in only one way so that all of the solar receivers containing the CPV cells, such as 24, maintain their alignment when installed in a CPV module. This pre-aligned state of the CPV cells is maintained in the multiple modules that make up each paddle structure. Next, the multiple modules, such as eight, contained in the paddle structure are aligned in the three dimensions with each other as they are attached to the paddle structure with a leveling fixture. The modules loaded with the CPV cells couple to the frame of the paddle, where 1) a leveling fixture, 2) the frames of the paddle, 3) the modules, and 4) leveling adjustments, such as shims, are used to once again maintain the set alignment with respect to the any other PV cells in that paddle. Next, the paddle structure with the CPV cells is shipped to the site. Note, the structure of the module housing and then the frame of the paddle lock the individually pre-aligned CPV solar cells within that paddle into their three dimensional alignment with respect to each other. Once the support structure is installed, the paddles then may be installed onto the multiple tilt axles. The paddles are shipped to the solar site where the stanchions, the slew drive motor and the roll bearings forming the tracking mechanism's support structure are set to create a level plane for the installed paddles.

The CPV solar cells in each set of CPV cells are housed in the multiple CPV modules that each contains multiple CPV cells. The modules containing the CPV solar cells when installed in the paddle structure come pre-aligned with respect to each other in all three dimensions and locked into this aligned condition through the module housing and frame of the paddle structure to minimize the installation time by eliminating any need to align each individual CPV solar cell within the paddle structure in the field.

In Step 2, the Field Installation and Coarse Alignment of the Components Forming the Support Structure of the Two-Axis Tracking Mechanism Occurs.

In an embodiment, three or more stanchions, a slew drive motor and two or more roll bearings form the support structure of a single two-axis tracking mechanism. A field installation at the site and coarse alignment of the components forming the support structure of the two-axis tracking mechanism is performed and afterward the one or more lasers shine through two or more components of the support structure of the two-axis tracking mechanism to allow fine tuning adjustments to the level and alignment of the support structure of the two-axis tracking mechanism in three dimensions.

FIGS. 4a and 4b illustrate a diagram of an embodiment of a stanchion that has two or more segments including 1) a concrete pillar portion with a capped bolt pattern portion above ground and a portion buried under the ground, and 2) a metal post section. A mating coupler between the concrete pillar and metal section has an adjustment mechanism in the three dimensions. An example alignment process for the stanchions, drive motor and roll bearings may be as follows.

First on the ground of the site, the height of the concrete on the bottom of the set of stanchions forming a portion of the support structure is coarsely set to essentially have all of the stanchions at the same height horizontally and also have the same vertical axis. This can be done even if the ground is uneven and not level. The stanchions consist of at least two or more distinct sections, including the bottom concrete pillar section and upper metal section, and the mating coupler between the concrete pillar and metal section has an adjustment mechanism in the three dimensions to allow a fine tuning of the stanchion height to essentially have all of the paddles eventually at the same height horizontally and the same plane vertically. The stanchions in the ground may be coarsely set and aligned in a number of ways including standard surveying techniques.

The concrete pillar portion may have a capped bolt pattern portion above ground and portion buried under the ground. The metal post section has a flange that slides onto the bolts that mate the metal and concrete portions together. The capped bolt pattern may be double nutted above and below the metal flange of the of the metal section of the stanchion to form a jack nutted set up to make accurate vertical (X) dimension, horizontal (Y) dimension, and diagonal (Z) dimension adjustments. Other adjustment techniques than double nutting on the mating connection between the two connections may be used including use of washers, clamps, adjustment nuts and other similar techniques.

The metal section above the ground affixing to the top of the concrete section may be a standard height/length. The surface of the concrete stanchion section above the surface of the ground is set to at least a minimum height so the sets of CPV solar cells contained in two or paddle assemblies installed on the two-axis tracking mechanism always have enough clearance to move the paddle assembly to any angle within a drive mechanism's range and not hit either the surface of the ground or another paddle assembly supported by a neighboring stanchion. This arrangement of motion control components of the tracking mechanism maximizes the degree of freedom to adjust the two-axis tracking mechanism's solar array to match the average movement of the Sun throughout the year unconstrained by installation of the tracking mechanism's support structure. The height of the stanchions for the two-axis tracking mechanism are set to be a same height horizontally, at the same vertical angle and diagonal angle by the mating coupler adjustment mechanism built into each stanchion that allows for these three dimensional adjustments after that stanchion has been set in place, such as in the ground or on a concrete pad.

Figure 5:
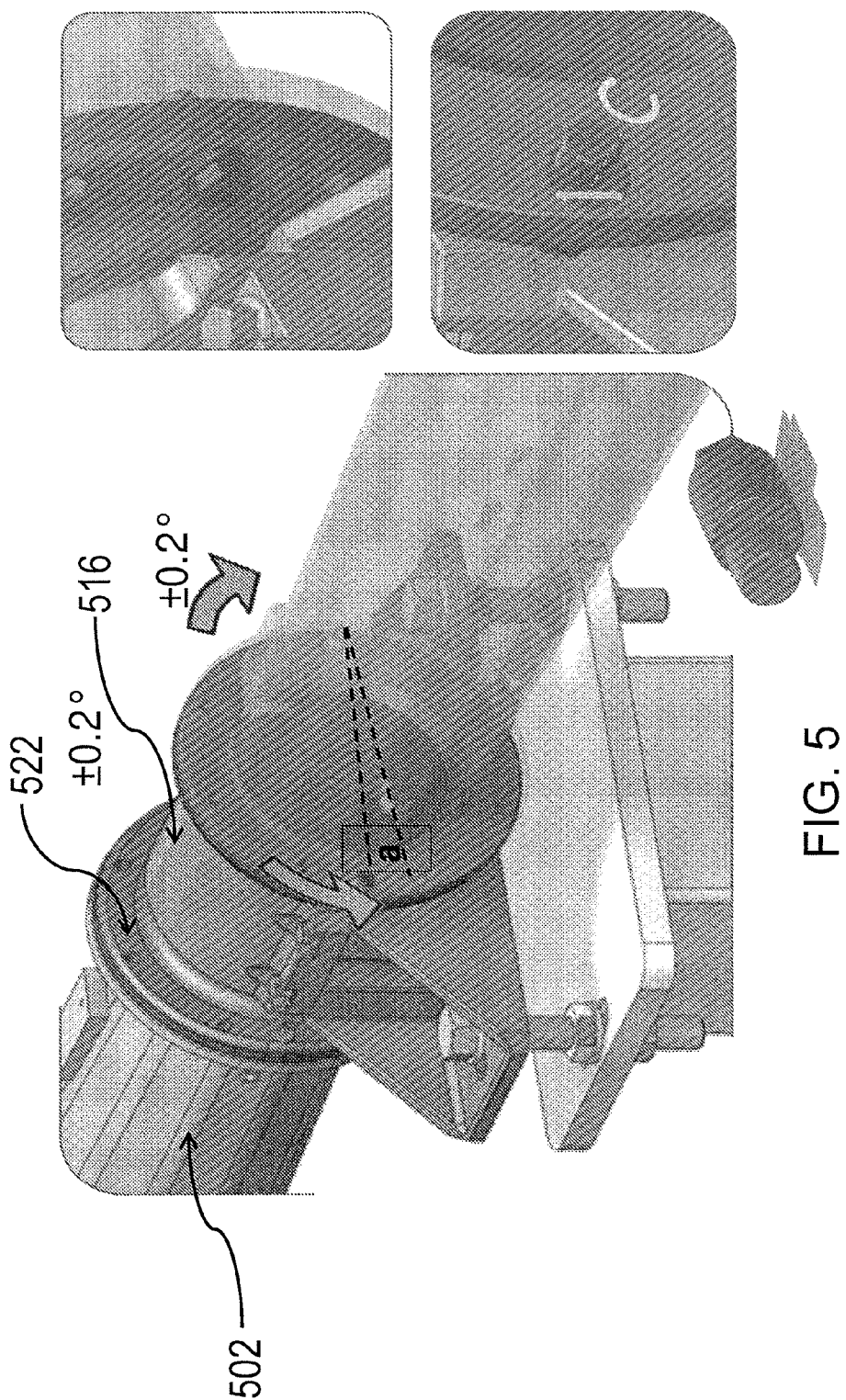
FIG. 5 illustrates a diagram of an embodiment of a roll bearing mounted on top of a stanchion and has a three axis adjustment mechanism.

FIG. 5 illustrate a diagram of an embodiment of a roll bearing mounted on top of a stanchion and has a three axis adjustment mechanism. The roll bearings have a three axis adjustment mechanism, via bolts and threads and over sized oval slots in order to position the bolts, for example, one inch in either direction from the center of the oval slot, to assist in leveling all of the roller bearings with respect to each other; and in essence, leveling the common roll axle supported by the roll bearings. The over sized, oval slots are machined into the mold of the housing in both directions 1) a north-south orientated oval slot and 2) an east-west orientated oval slot. The three axis adjustment mechanism also includes height adjustments via, for example, a number of washers used between mating surfaces, use of double sets of lock nuts, etc., between the mounting plate of the roll bearing and the top surface of the metal segment of the stanchion. Diagonal z dimension adjustments can be made with uneven height adjustments between the two sides of the roll bearing relative to the top surface of the metal segment of the stanchion. The roll bearing with its three axis adjustment mechanism and mounting plates control the centerline axis of the common roll axle.

Figure 6:
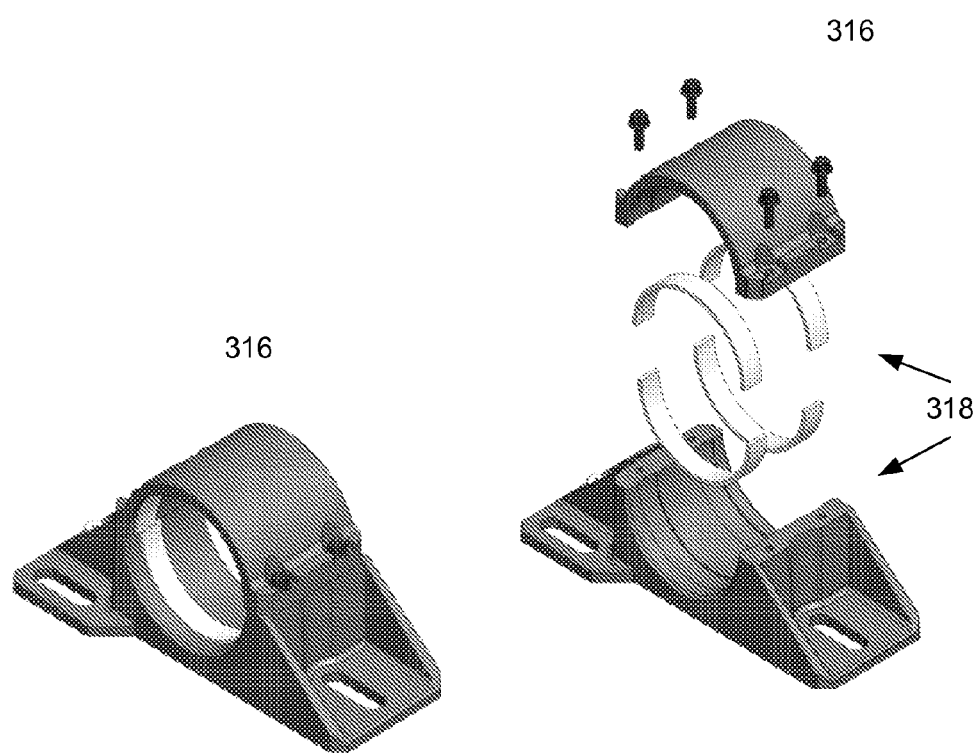
FIG. 6 illustrates a side perspective diagram and an exploded view of an embodiment of roll bearing assembly with plastic bearings inside.

FIG. 6 illustrates a side perspective diagram and an exploded view of an embodiment of roll bearing assembly with plastic bearings inside. Each roll bearing assembly 316 may have ultra high molecular weight plastic bearings 318 designed for life-long wear to minimize maintenance in the field. The support structure also provides the axial constraint for the common roll axle as the axle rotates. Axial constraint on the common roll axle is provided by the bearings in the offset machine slots. The rotational constraint on the common roll axle is provided by the top cap and bottom of the roll bearing housing. The coupling to the slew drive also supports the axial constraint.

The offset grooves created inside the molded housing of that roll bearing hold the Ultra High Molecular weight plastic bearings 318 in place and prevent them from rotating with the common roll axle. The offset groves on the top and bottom of the housing of the roll bearing act as a physical block to prevent the sections of the Ultra High Molecular weight plastic bearings 318 from rotating in place with the spindle as the spindle rotates within the roll bearing.

Referring to FIG. 5, In addition, the support structure has roll bearings, such as a first roll bearing assembly 516, and a slew drive that have mating connections shaped and pinned to only couple with sections of the common roll axle 502 in a pre-designed configuration which substantially establishes a proper alignment. The bolt holes on the flange, key pin holes and rectangular slot for pins are in the same corresponding positions for the mating of the flange of the spindle 522 to the flange of the roll axle 502. The roll axle 502 on narrow section has cable management brackets mounted and built into the roll axle to speed installation process in field.

The spindle 522 may rest upon a bottom half of the roll bearing assembly 516. While in this position, the roll axle and the flanges of the spindle 522 are aligned using the indexing pins on the plate, and mated together. The spindle 522 has these flanged connections with keyed pins and holes so the flanges of the spindle 522 and two sections of roll axle only mate up in one way to provide a fast installation process that maintains the alignment of the roll axle over all the sections making up the common roll axle 502. The spindle 522 is made of a metal such as cast iron and then coated with a corrosion resistant material/metal with a low friction co-efficient that also significantly resists wear, such as chrome, with a minimum thickness of, for example, at least 15 microns and preferably 35 microns, to last the expected lifetime wear of the two-axis tracking mechanism.

Figure 7:
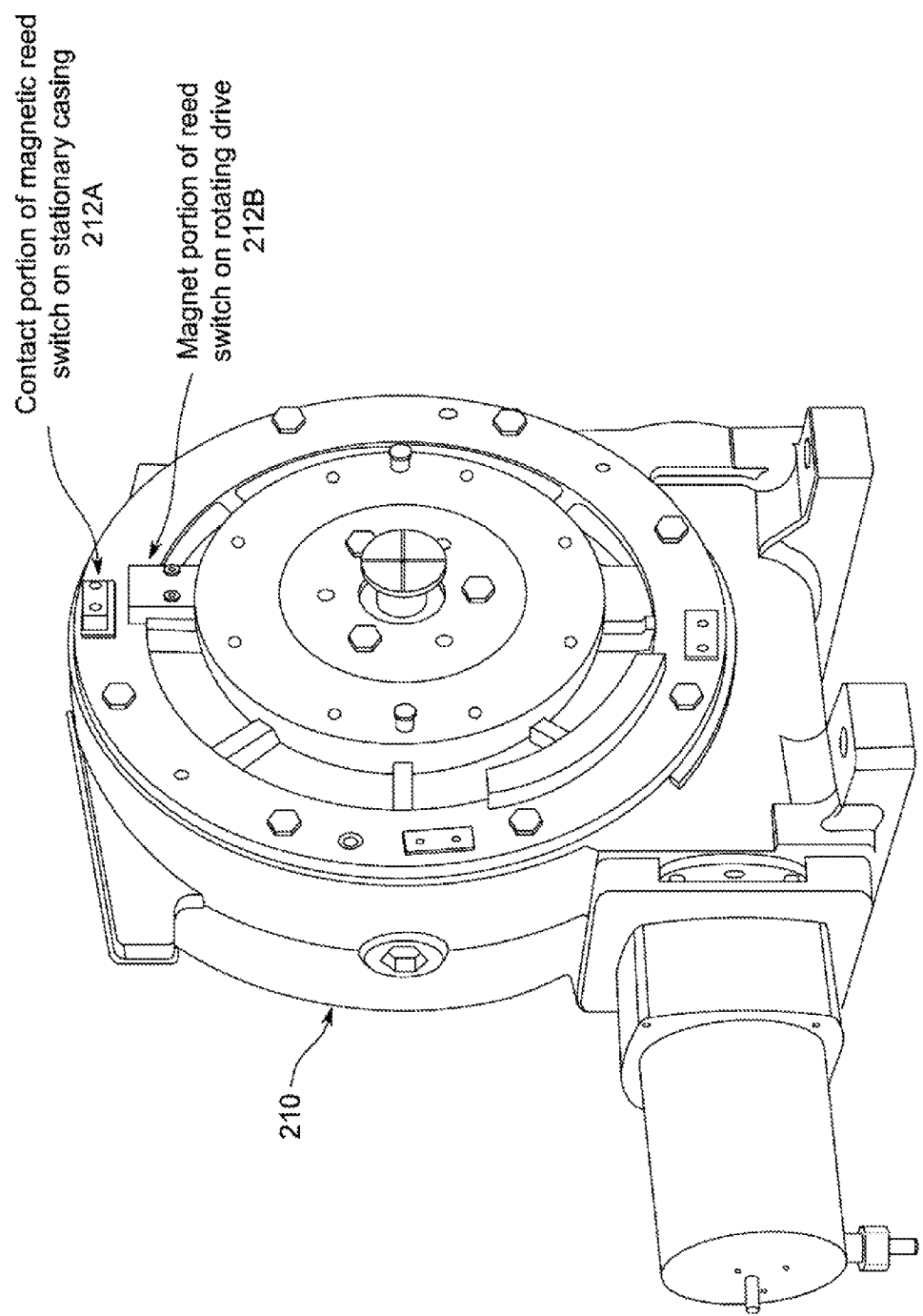
FIG. 7 illustrates a diagram of an embodiment of a slew drive motor.

FIG. 7 illustrates a diagram of an embodiment of a slew drive motor. Two or more sections of the common roll axle couple to the slew drive motor 210. Each section of roll axle connect on one end to the slew drive and then each roll axle couples with a corresponding roll bearing at the other end. The narrower ends of the conical roll axle each may have a flanged indexed connection plate and each roll bearing assembly has alignment pinholes for maintaining the roll axis alignment of the solar two-axis tracking mechanism. The slew drive motor 210 and the roll bearing assemblies are supported directly on the stanchions. These modular components of the two-axis tracking mechanism are easily assembled in the field.

Step 3: the Fine Tuning Alignment of the Components Forming the Support Structure of the Two-Axis Tracker Mechanism Via Using One or More Lasers.

FIG. 8 illustrates an embodiment of an assembly of portions of the support structure of each tracker mechanism and then aligning the support structure of two or more tracker mechanisms in stages. Each tracker mechanism in the row of multiple tracker mechanisms may have its slew drive installed onto a stanchion. One or more, such as two lasers, may be used to align one or more tracker mechanisms.

Figure 9:
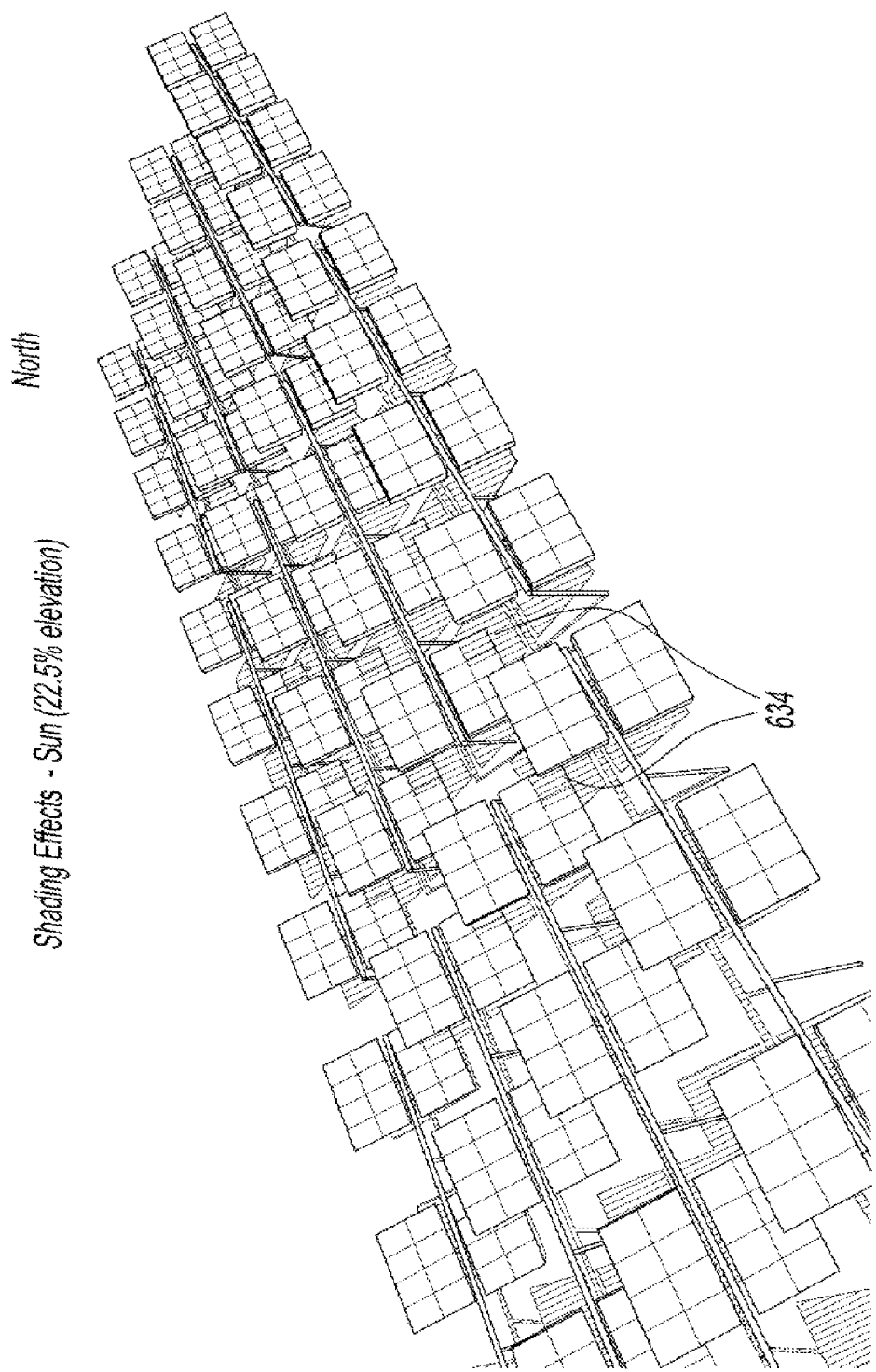
FIG. 9 illustrates an embodiment of rows and columns of fully assembled two-axis tracker mechanisms laid out in a field of tracker mechanisms.

FIG. 9 illustrates an embodiment of rows and columns of fully assembled two-axis tracker mechanisms laid out in a field of tracker mechanisms. At the site, an organized field of these two-axis tracking mechanisms is laid out as part of that solar generation site and multiple tracking mechanisms in a same row, such as a second row 634, may be aligned at the same time. Thus, a single set up of the one or more lasers can be used to align multiple two-axis tracking mechanisms in each row of tracking mechanisms in a field layout of tracking mechanisms.

Referring back to FIG. 8, the alignment process may use one or more lasers 940 aimed at a center axis of 1) one or more roll bearings 916 and 2) one or more slew drives 910 to fine tune the alignment of these components in their vertical, horizontal, and diagonal dimensions. Thus, a field installation at the site is performed for the components forming the support structure of the two-axis tracker mechanism, which those components as assembled are keyed and shaped to set a coarse alignment of the support structure of the two-axis tracker mechanism. After the coarse alignment, then one or more lasers are shined through two or more components of the support structure of the two-axis tracker mechanism to create and fine tune the level and aligned support structure of the two-axis tracker mechanism in the three dimensions by adjusting mechanisms built into the components of the support structure to achieve the level and alignment relative to the beam of the lasers.

An example alignment process may be as follows. Each two-axis tracker should have its slew drive installed on its own stanchion as described above.

One laser may be set up for aligning the multiple tracker assemblies by attaching at one end of a first tracker such as being inserted within a roll bearing at that end. These one or more lasers are aimed along components of the support structure of the two-axis tracker mechanism to create a level and aligned support structure of the two-axis tracker mechanism in three dimensions vertical (X) dimension, horizontal (Y) dimension, and diagonal (Z) dimension, at a site where the concentrated photovoltaic system is to be installed. At the roll bearing 916, place the laser 940 with its target mark at the center of the bearing cylinder between the top and bottom of the roll bearing 916. Adjust the roll bearing mounting nuts so that the laser alignment beam touches the top of both of the straight-edges at the center mark. When centered, make the mounting nuts hand tight for now. On a first slew drive 910, make an alignment cross-hair mark on the side of the slew drive motor cylinder at the center of the slew drive hole in first two axis tracker mechanism. With an observer at the slew drive unit 910, adjust the self-leveling alignment laser 940 up and down and rotate it until the spot is on the center of the slew drive cross-hairs. The alignment laser may be placed into the roll bearing 916 or alternatively clamped in a stable position.

Next, at the slew drive 910, place a target mark at the center of the bearing cylinder at the connecting edge between the top and bottom of the slew drive 910. Adjust the slew drive mounting nuts so that the laser alignment beam touches the top of both of the straight-edges at the center mark. When centered, make the mounting nuts hand tight for now. Alternatively or in combination, make fine tune adjustments on the leveling mechanism on each stanchion with a mounted slew drive to align the two or more tracker mechanisms. As the alignment proceeds, move the cardboard targets to the next slew drive in the row of trackers and repeat this alignment for that slew drive. Remove anything from the hole in the earlier slew drive so that the laser alignment beam shines through, and repeat the alignment again for each of the slew drives in the row of mechanisms. The slew drives are now aligned for each tracker assembly. Note, during the tracker alignment with the one or more lasers, all of the stanchions, all of the slew drives, and all of the roll bearings may contain roll axis and tilt axis leveling adjustments mechanisms in the three dimensions. Additionally, at least the stanchions and roll bearings have the leveling adjustments mechanisms built into their structures. In an alternative process, two or more lasers, one at each end of the tracker assemblies, may be set up to check the alignment through the central axis of the multiple discrete two-axis tracker mechanism at the same time.

Additional tasks can include as follows. Attach a stanchion laser mount jig to the end side of the stanchion. Since a laser alignment process uses this first stanchion hub to mount the adjustable transit laser the first stanchion hub does not get aligned via lasers. It is initially aligned by measuring from stanchion top to hub and located to mid travel in slots. The laser alignment may consist of one calibrated laser and one transit laser (see FIG. 11). One can also conceivably calibrate the transit laser to align the last, or rather first stanchion.

Figure 10A:
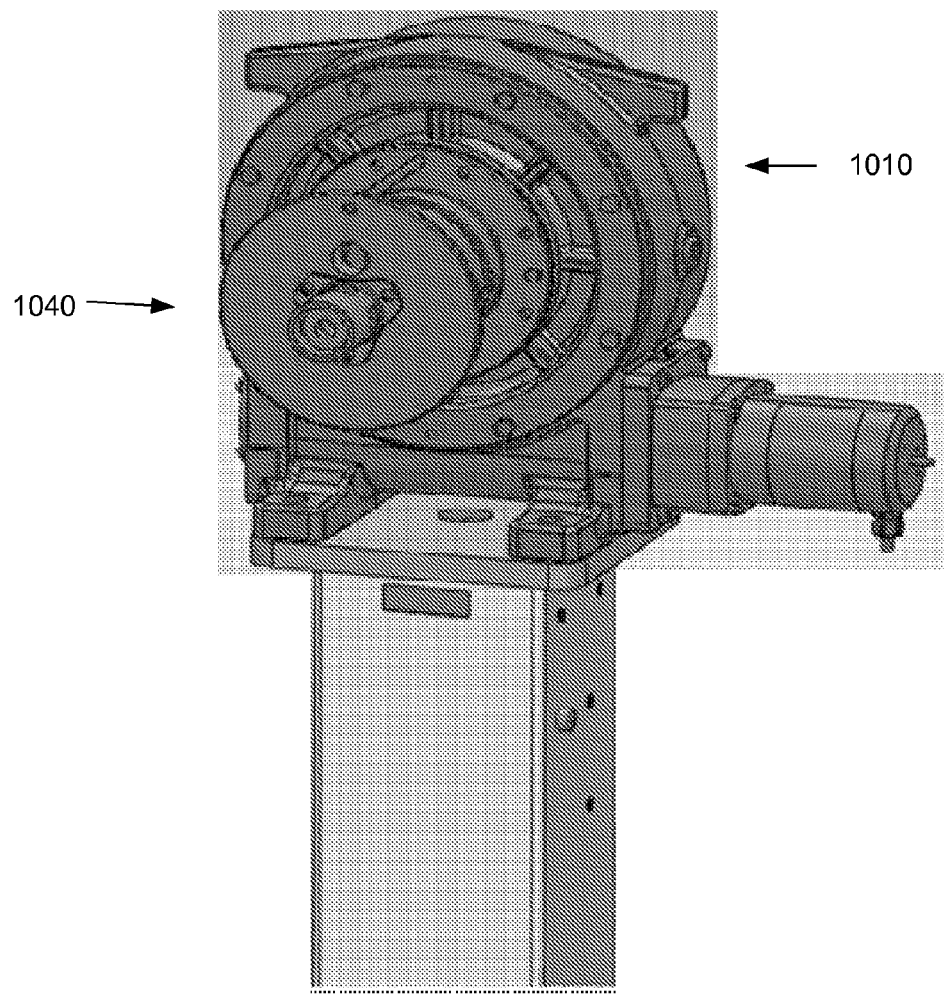
FIGS. 10a and 10b illustrate an embodiment of a laser alignment tool.
Figure 10B:
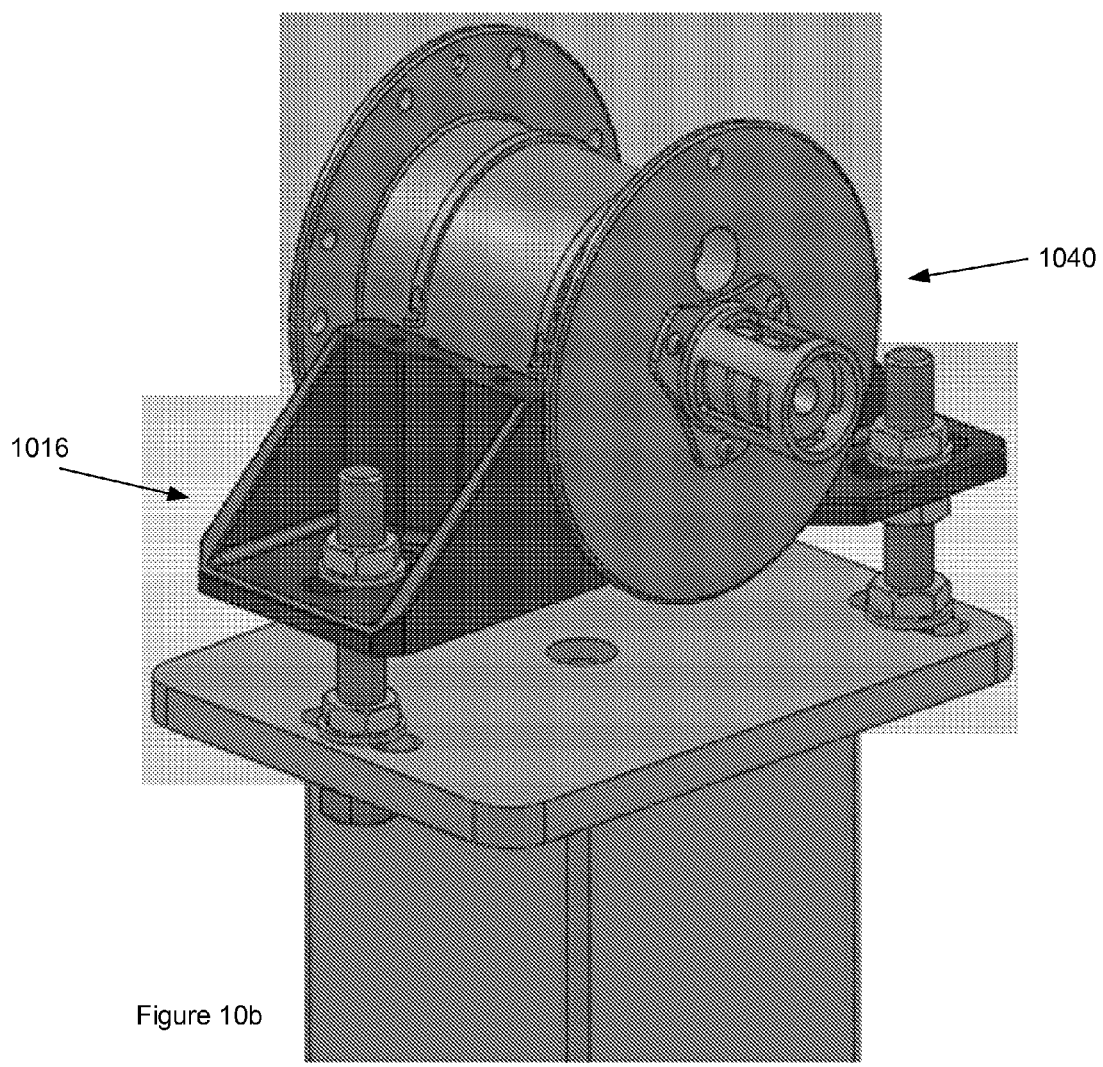

FIGS. 10*a* and 10*b* illustrate an embodiment of the laser alignment tool 1040. The laser alignment tool 1040 may be shaped to fit into a roll bearing 1016 and have a central laser beam installed that has adjustments to ensure the laser beam is coplanar when rotated. The laser alignment tool 1040 also has a flange to mate up with a slew drive 1010. The roll bearing 1016 cradles the laser alignment tool 1040. The laser sits in the middle of the central roll axis of the two-axis tracker mechanism making it very easy to make adjustments to accurately align the components via the laser beam. Thus, a first roll bearing at the end of a first two axis tracker mechanism cradles a first laser, such as a green wavelength laser, which is pointed through the holes of two or more slew drives to align the multiple two axis tracker assemblies at the same time. Each two-axis tracker assembly has its own slew drive. The laser alignment tightens the fasteners at the first roll bearing housing with the transit laser cradled inside the roll bearing housing. This calibrated laser is rested in the roll bearing housing on the far stanchion and the beam is shot from transit laser using a beam steering device to a calibrated laser thru the slew drives to far stanchion. Next, the process starts to work the calibrated laser back toward the first stanchion; aligning housings and slew drives. The iterative adjustment process passes the laser beam thru the center of the slew drives. When one or more slew drives are out of alignment, then enough beam will become eclipsed by a previous slew drive. The process goes back to make alignment adjustments to the height, diagonal, or horizontal dimensions of the slew drive, via the slew drive's mounting nuts and washers or the stanchions mounting nuts and washers, until the laser beam goes through the center of all of the slew drives. The laser(s) may use green wavelengths because these travel further than other wavelengths and an optical collimator to control the length traveled, intensity of the light, and spreading of the focal spot of the laser. Note, in a laser to laser technique, a laser is installed on both end points of the row of multiple two axis tracker assemblies. In this example, calibrated opposing lasers are used to perform the fine tuning alignment. Also, during the alignment the process can shoot the laser beam through components in the support structure because the beam goes through actual axis of the mechanism or the laser beam can be located above or parallel to the mechanism's roll beam.

In an embodiment, after the slew drives are installed and aligned, then the roll bearings are installed and aligned in stages. The two lasers are able to shoot a line through, for example, the four slew drives of the four discrete tracker assemblies, and then without readjusting slew drives align the 16 roll bearings from the four discrete tracker mechanisms. A second laser with a target in its center is placed on successive neighbor stanchions and roll bearings to adjust the bolt and nuts for vertical horizontal and lateral angular X, Y, and Z adjustments. A tool may be placed that shows when two laser beams shot in opposing directions are not aligned and shows the divergence between beams. After the slew drives are installed and aligned, then a neighboring roll bearing is installed on a stanchion and aligned. Thus, the process moves the laser with its center target to the next roll bearing in line and repeats this alignment to the center for that bearing. Both the stanchions and the roll bearings contain three dimensional adjustments mechanisms built into their structure.

Step 4: Installing and Aligning Segments of the Common Roll Axle/Drive Shaft onto the Support Structure of the Two-Axis Tracker Mechanism and Coupling Those Segments to Two or More Components in the Support Structure of the Two-Axis Tracker Mechanism.

Once the stanchions, roll bearings, and slew drive motor are fine tune aligned horizontally, diagonally, and vertically, then each section of the common roll axle and tilt axle assembly for each of the four CPV paddle pairs can be installed. Each section of roll axle and tilt axle assembly is coupled together at the ends of the roll axle by 1) a spindle in a roll bearing, 2) the slew drive motor, 3) a roll bearing and 3) any combination of these three, in order to form the common roll axle for the two-axis tracker mechanism.

Figure 12:
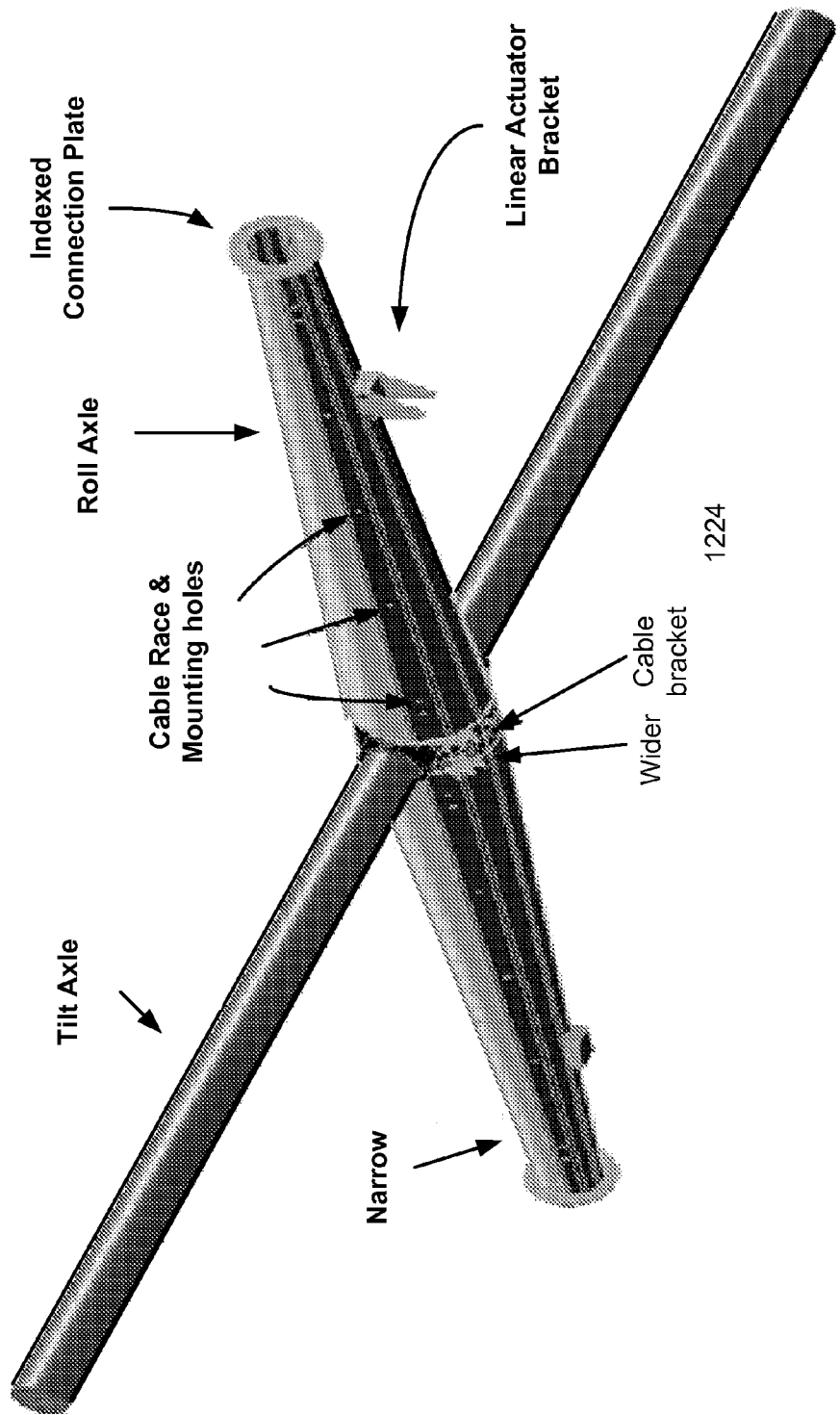
FIG. 12 illustrates a diagram of an embodiment of a section of the conical roll axle and a perpendicular tilt axle.

FIG. 12 illustrates a diagram of an embodiment of a section of the conical roll axle and a perpendicular tilt axle. The common roll axle includes two or more conical shaped sections of roll and tilt axles 1224 that couple together via any of 1) a coupling mechanism including a spindle, 2) a roll bearing assembly, 3) a slew drive motor coupling to a flanged narrower section of the conical shaped roll axle, and 4) any combination of the three. Each section of roll axle 1224 is pinned and keyed, using for example slots and oversized holes, to couple to a spindle contained with a roll bearing or to a slew drive in the pre-designed manufactured to maintain the alignment of the roll axle along the roll axis and the individual tilt axles along the tilt axis. Thus, the common roll axle has large pinned holes and slots at its mating flanges to allow the roll axle sections to couple together, either directly or through in interface component such as the spindle, in an aligned way. The roll bearing at the junction of the shared stanchion contains a spindle to couple sections of the roll axle to form a common sectioned roll axle that can be driven by a single slew motor. The spindle on each roll axle may connect into the bottom half of the roll bearing. While in this position, align the roll axle and the face plate on the slew drive motor using the indexing pins on the plate, and mate them together. Next, seat the spindle and insert the indexing pins on the face plate. Next, couple a second roll axle and tilt axle assembly and repeat the above steps except this time bolt the end of the new roll axle to the indexed face plate on the connector spindle of the previous roll axle. Overall, when all the sections of roll axle and tilt axle sections are assembled the common roll axle will be in a horizontal, vertical, and tilt alignment.

Multiple tilt axle and roll axle assemblies form the common roll axle and each segment shares the support of at least one or more common stanchions between the two segments.

The narrower ends of the roll axle each may have a welded on flanged that has an indexed connection plate to assist in ease of installation in the field and the maintaining the alignment of the common roll axle throughout the entire tracker assembly. A wider section of the conical shaped roll axle is connected approximate the tilt-axle to assist in the higher torque requirements that occur at that intersection. The multiple paddle-pairs each have a tilt-axle that pivots perpendicular to the common roll axle. Conical roll axles for strength that is thick in the middle where the torque demands and strength are needed and thinner at the edges where the coupling occurs to the roll bearing. The wider conical section has a diameter to withstand the wind torque requirements up to 75 MPH gusts, and be able to dampen resident harmonics between 1-3 hertz. The wider conical section bolts to the tilt hub in the manufacturing facility.

The metal surfaces of the conical roll axle and tilt axle assembly have a clear coat type paint finish to prevent corrosion.

As discussed, the keyed and shaped components in the roll bearings, spindle, slew drive and segments of roll and tilt axles are configured to allow the component parts of the tracker assembly to only couple/connect to each other in the pre-designed configuration which substantially establishes the proper alignment. For example, the mating surfaces of the roll bearings and the slew drive are both 1) shaped to match a shape of a flange on a segment of roll axle and 2) pinned to match a pattern on the flange of the segment of roll axle to only couple with the roll axle in the pre-designed configuration which substantially establishes the proper alignment. Likewise, the indexing pins on a spindle and indexing holes on a faceplate of the slew drive are shaped and patterned to only couple to each other in the pre-designed configuration.

In one instance, each conical/tapered roll axle section is placed on each side of the tilt hub perpendicular to the tilt axle. A cable grommet bracket is placed along the outside of the bolt pattern of the large end of each roll axle segment adjacent to each other across the tilt hub. The roll axles segments are connected to the tilt hub with bolts. The tilt-axle pivots perpendicular to the roll axle.

The tilt hub is bolted onto the wider conical portions of the roll axle and then has the tilt axles inserted into the tilt hub via a heat shrinking process. The conical roll axles have a face plate with a threaded hole pattern welded onto the wider conical side of each roll axle section. The tilt hub is molded and mates to each segment of conical roll axle with bolts and to each segment of the tilt axle via a heat shrink process. The molded housing of tilt hub has multiple cavities rather than being one solid cylinder.

Each segment of the tilt axle may be "heat-shrunk" into a machined hub. Alternatively, the tapered roll axle may be "heat-shrunk" into a machined tilt hub. The "Heat-shrunk" process removes a weld affected zone at the highest stress point.

The tapered roll axle connects into the machined tilt hub at an angle perpendicular to the tilt axle. The part design reduces stress and increases stiffness. The roll axle is able to roll side to side + and −180 degrees. The fixed tilt axle allows the paddle pair to be rotated around the axle by a linear actuator up and down + and −180 degrees. Thus, the machined hub provides structural support for both the roll axle and the tilt axle while allowing independent rotation of the paddle pair coupled to that tilt axle. The roll bearings engage each section of roll axle to allow all four of the paddle pairs to rotate/be driven by a single slew motor simultaneously in the roll axis.

Each tilt axle assembly is designed for easy sliding on of each paddle onto that tilt axle.

The roll bearing and the slew drive motors control the position of the tilt and roll axis angles of the paddles to orient the optics such that the maximum incoming light is focused to the photovoltaic collectors/receivers in the paddle pair. The roll bearing has multiple adjustment points to assist in adjusting the three dimensions to allow the common roll axle and correspondingly the paddle pairs in the solar array to be in alignment with each other. Additionally, the roller bearings have "no lube" bushings. Thus, no lubrication is needed to be applied to these bearings during the expected life of the roll bearing. The roll bearing housing provides axial support for the potentially rotating sections of the conical roll axle from different paddle pairs.

Referring to FIG. 7, the slew drive on each side couples with a segment of a roll and tilt axle assembly. The slew drive has a hole in the center for alignment, high torque gearing, and keyed flange connections to match a mating surface of either 1) the laser alignment tool and/or 2) a segment of roll axle. The hole in the center of each slew drive allows alignment of the entire tracker assembly via light laser beam through the middle of slew drive during alignment. The clocking pins built into face of slew drive as discussed maintain rotational accuracy of the common roll axle but also aid in providing mechanical support for the torsional bending occurring at this interface. The slew drive is engineered for high torque ability by a high worm gear ratio which has its torque capability multiplied by a separate gear box with a high ratio. All of the gears are made of harden material to support high torque on the teeth of those gears. Reed sensors are built into a slew drive assembly prior to shipping to the field for installation, to speed up the installation process and make installation more modular. The slew drive is also manufactured with handles on top or with holes or slots to potentially slip a strap through to lift up the drive and the bottom is formed to make a cap for the stanchion and fit on top of a stanchion in only one way to aid in speed of installation.

A connector spindle is located between sections of roll axle inside the roll bearing. The connector spindle connects two sections of conical roll axle within a roll bearing. The connector spindle has indexing pins to ensure that the tracker components are accurately installed to maintain the vertical, horizontal, and tilt alignment during the assembly of this solar array. Each connector spindle also assists to connect the tapered roll axle sections between two pairs of paddles; and thereby, allow angular roll rotation of all four paddle pairs to be controlled by the slew drive of this tracker assembly. The roll bearing and connector spindle transmit the rotation of the slew drive to the common roll axle.

Step 5, Installing and Aligning of the CPV Cells that have been Previously Pre-Aligned with Respect to Each Other, Such as in Pre-Aligned Modules Contained in Paddle Structures, onto the Multiple Tilt Axles of the Tracker Mechanism, which are all Perpendicular to the Common Roll Axle.

Figure 13:
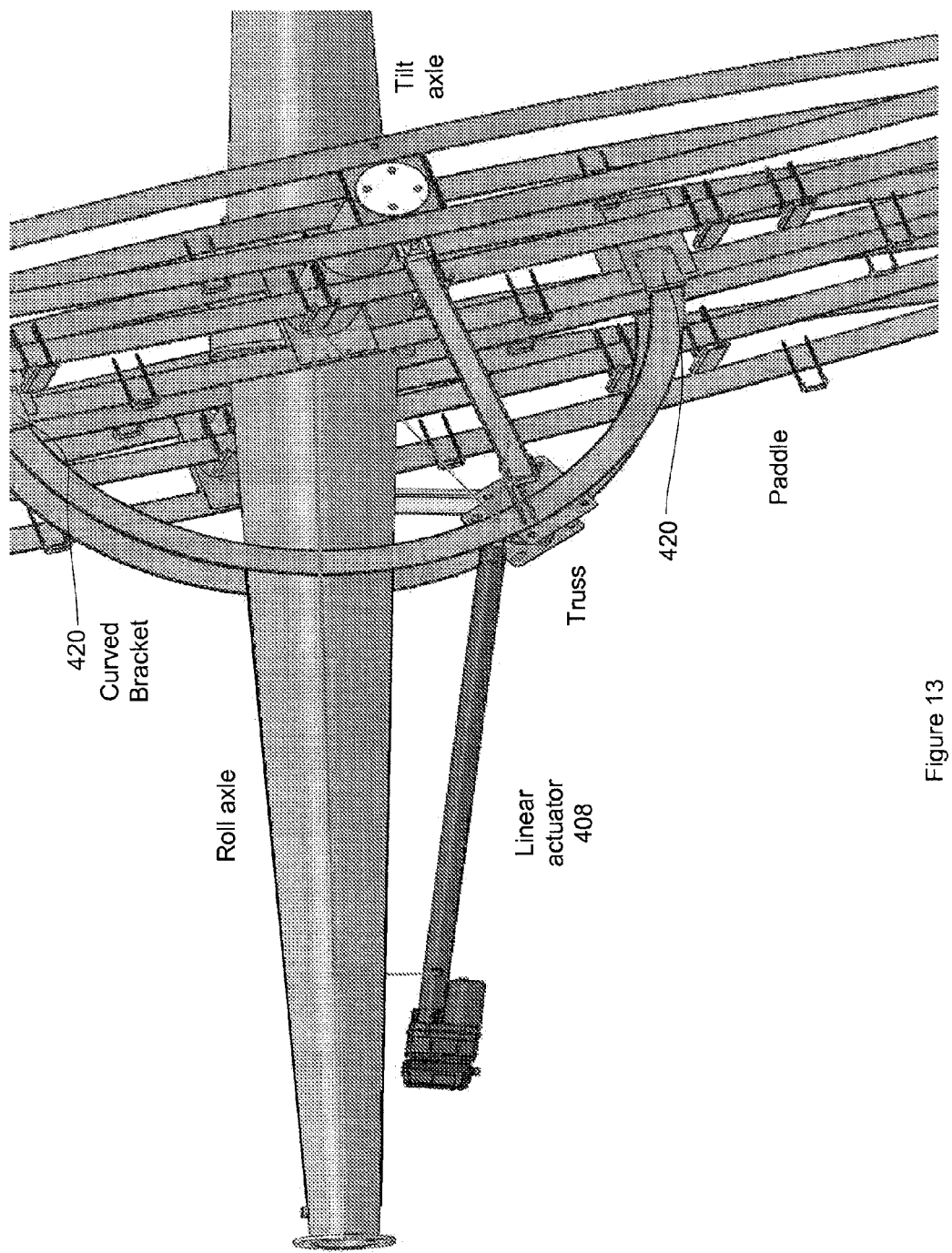
FIG. 13 illustrates a side perspective diagram of an embodiment of a linear actuator coupling to curved brackets and a center truss of each paddle assembly.

FIG. 13 illustrates a side perspective diagram of an embodiment of a linear actuator 408 coupling to the curved brackets and center truss of each paddle assembly. The linear actuator 408 connects and runs along the length of the conical roll axle. Note, the skeletal form of both paddles in the paddle pair is shown without the set of CPV modules installed to illustrate a more clear connectivity of this example embodiment of the roll axle, tilt axle, folding curved bracket structure, and linear actuator.

As discussed, a linear actuator 408 per each paddle pair allows independent tilt rotation for each of these paddle pairs on the solar array and control of the paddle's tilt actuation. Note, other drive mechanism may also be used to move the paddle pair.

Figure 14:
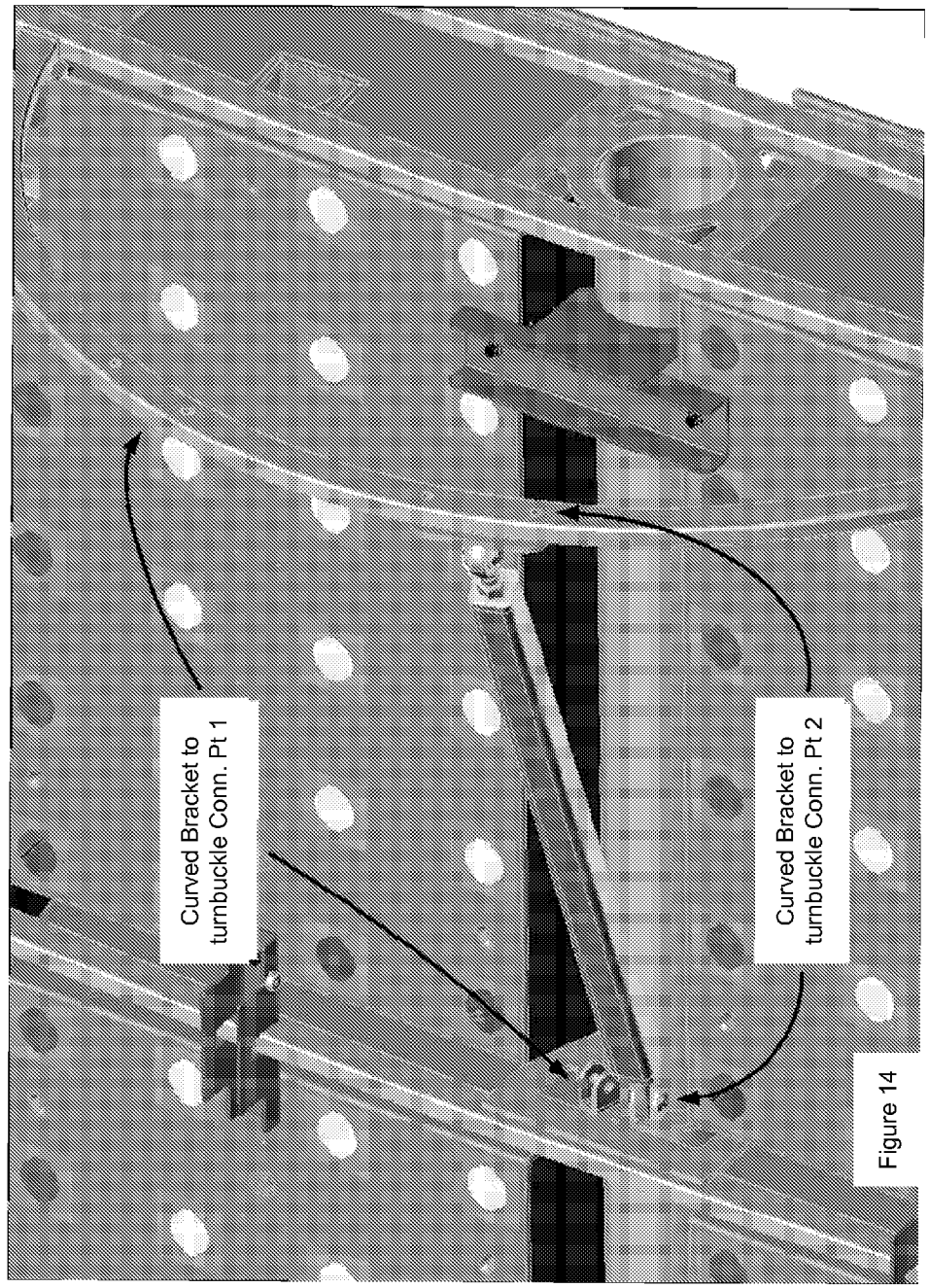
FIG. 14 illustrates a diagram of an embodiment of the connection points on the curved bracket to a turnbuckle on a paddle structure.

Each curved bracket with built in hinges 420 couples to and is part of its own paddle structure. Each curved bracket has hinges to fold flat against its paddle skeletal frame when the paddle is shipped and to allow easy maneuverability when assembling paddle pair in the field. A center truss connects between the curved brackets when installed in the field to allow the connected linear actuator to cause paddle tilt articulation on the tilt axle. The center truss has a fixed set of holes that the linear actuator is configured to connect to, and likewise, a mounting bracket to support the linear actuator is built onto each roll axle section in a fixed spot so the length of travel for each linear actuator is always correlatable to an exact position of the paddle assembly on the two-axis tracker mechanism. See for example, FIG. 14, the connection points on the curved bracket to turnbuckle, can only be coupled at exactly known locations. This way when the linear actuator couples to the center truss and curved bracket assembly, the system can know exactly the angle and amount of movement that will occur with the paddle through movement of the linear actuator. Referring back to FIG. 13, the linear actuator 408 couples to the bottom of the roll axle on one end and to the center truss of the folding structure on the other end. The center truss couples to the inside surface of the two semicircular curved spider brackets. A turnbuckle arm on each paddle couples to the outside surface of its semicircular curved spider bracket. The length of the radius of the curved bracket is chosen to locate the bottom of each curved bracket where the center truss will connect to, to be centerline with the center of the tilt axis and roll axis. The symmetrical design of the paddle assembly and its curved brackets is designed to neutralize wind loads due to relatively a same wind force being felt on a rectangular front surface of the paddle structures, which is then transmitted through the hinges of the curved brackets to the center truss. Likewise, the turnbuckles on each side of the paddle assembly also transmit the wind forces being felt on the rectangular front surface of the paddle structures through the turnbuckle and curved brackets down to the center truss. In the center truss, the wind forces from the two sides meet and cancel each other out to allow the drive motor of the linear actuator to merely drive the weight of the paddle and not have to constantly fight back the forces of the wind to maintain the position angle of the paddles.

The linear actuator 408 couples to the turnbuckle and center truss of the paddle structure in a nearly vertical orientation. Keyed and shaped components are configured to allow the component parts of the 4 paddle assemblies installed on the tracker assembly in the solar array to only couple/connect to each other in the pre-designed configuration, which substantially establishes the proper alignment. The linear actuator motor connects into its mounting bracket built into that segment of the common roll axle, and the eyebolt on the end of the extender arm of the linear actuator uses a clevis pin and a cotter pin into its receiving bracket on the center truss. The turnbuckle arm with its two clevis pins and cotter pins that couple to the curved brackets on hinges is part of the folding structure 420. With the curve bracket on its hinges in its fully extended position, the turnbuckle arm can be installed in either of two known and fixed positions on the curved spider bracket. The clevis pins and cotter pins make the connections between the turnbuckle eyebolts and the brackets receiving them.

The curved brackets of each paddle lock together through the center truss and turnbuckle arms to form a paddle assembly that moves in unison. Thus, the paddle with its hinged curved bracket is configured to allow the paddles to form a paddle assembly on the two sides of the common roll axle along the tilt axis. To form a paddle assembly on a given tilt axle, each paddle may be rotated into a nearly vertical position and while applying pressure on the two paddles with first physical mating and then with the jack screws or jack nuts to bring the bolts on the spider center truss to the same reading to within +/−0.1 degree. When they are parallel, tighten all four bolts on the spider center truss and torque them. Next, rotate the paddle assembly to a horizontal position and then couple each turnbuckle arm between the center truss the skeletal frame of the paddle assembly.

Figure 15:
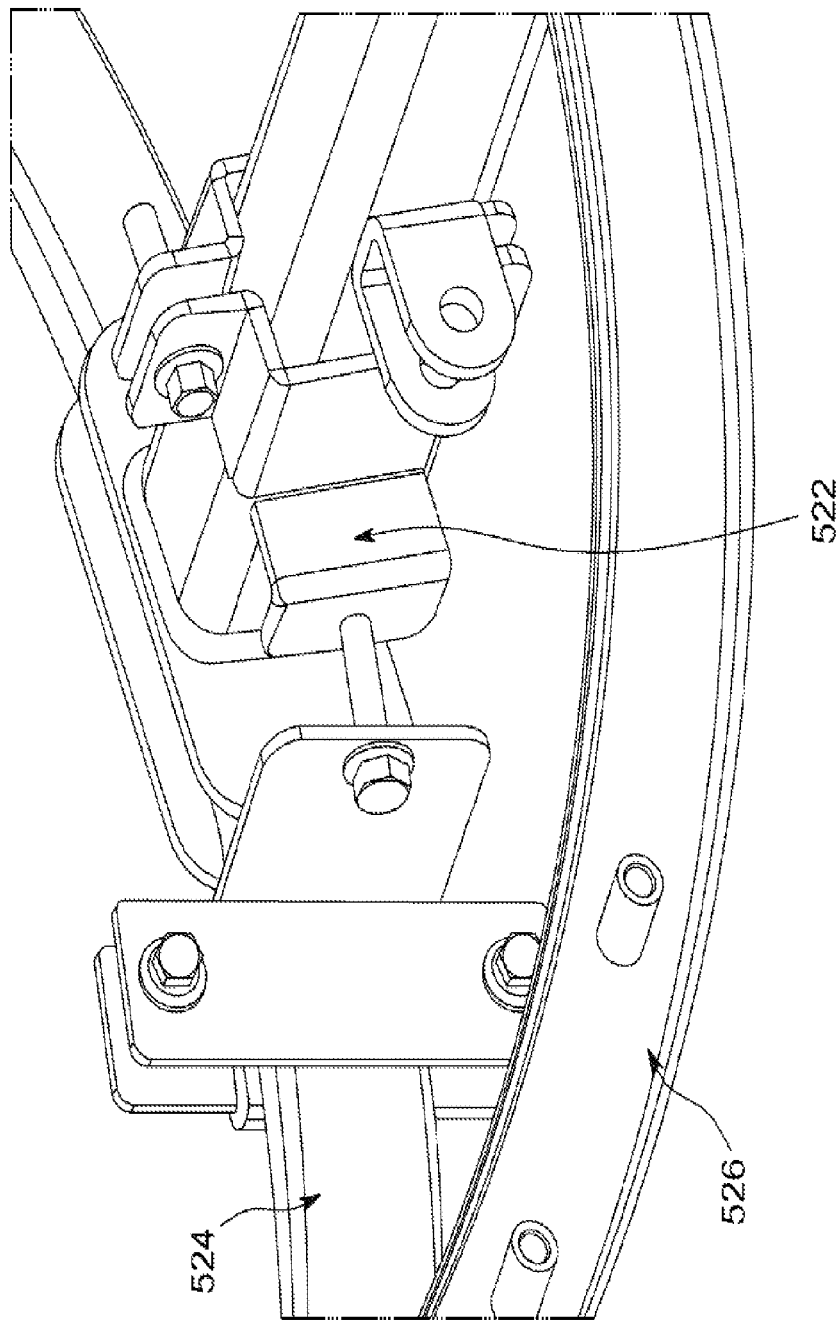
FIG. 15 illustrates a diagram of an embodiment of a center truss coupling a paddle pair to form a paddle assembly controllable by a single linear actuator.

FIG. 15 illustrates a diagram of an embodiment of a center truss 522 coupling a paddle pair to form a paddle assembly controllable by a single linear actuator. The center truss 522 is installed and connected between the semicircular curved spider brackets 524, 526 on each paddle in order to make the two paddles a single paddle assembly controllable by a single linear actuator. When the truss 522 is installed, the paddle pair is now coupled together. FIG. 5 illustrates one possible example coupling and leveling adjustment mechanism between the center truss and curved brackets.

Figure 16:
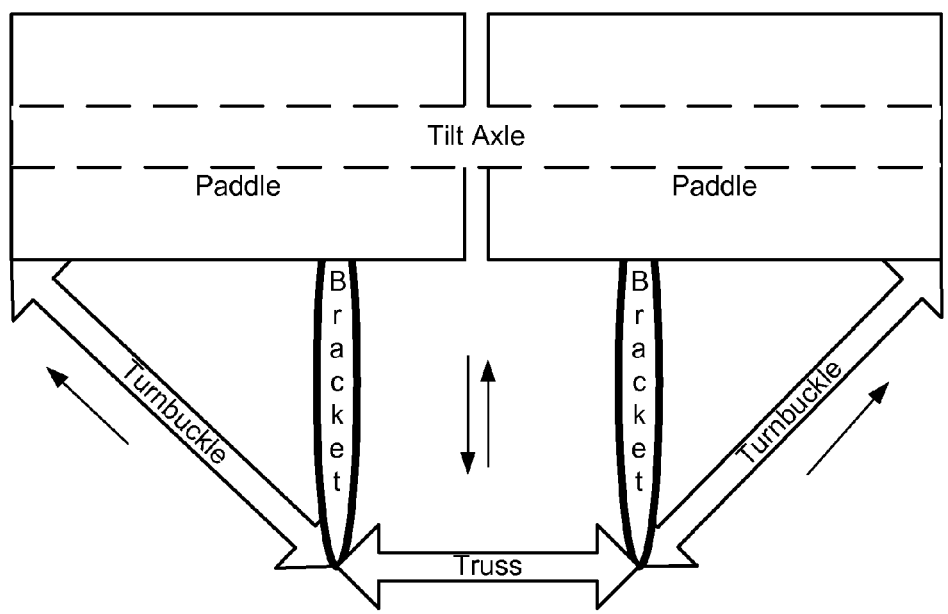
FIG. 16 illustrates an embodiment of the tilt axle paddle-to-paddle alignment in the horizontal, vertical, and diagonal dimensions.

FIG. 16 illustrates an embodiment of the tilt axle paddle-to-paddle alignment in the horizontal, vertical, and diagonal dimensions. The center truss, a curved bracket per paddle structure, a frame of each of the paddle structures, a tilt axle, and the turnbuckles form the support structure for the set of CPV solar cells that are housed in two or more CPV modules in the paddle assembly. The paddle pairs on each side of the tilt axle can be aligned with respect to each other. Thus, the two separate paddles forming a paddle assembly on each tracker stanchion are aligned with each other. In one instance, any combination of the two turnbuckle arms or adjustable width center truss may be used to assist in the leveling alignment of the paddles in essentially the roll axis with respect to each other. For example, the turnbuckle arm is expanded or contracted until the digital level readings are level in the same plane to eliminate bowing in the roll axis with respect to each other. In addition, a leveling adjustment mechanism for the curved bracket may also be used to assist in the leveling alignment of the paddles in essentially the tilt axis with respect to each other. Each turnbuckle arm may be extended or contracted by turning the turnbuckle arm to match the holes in the curve bar extension for the initial coupling between the paddle and center truss. This installation of the turnbuckle arm is repeated for the other paddle in the pair. During the horizontal leveling of the paddle pair, small adjustments occur to level the paddles by turning the turnbuckle arm of either side's turnbuckle. The turnbuckles can be 1) adjustable to affect the roll axis leveling and angle of the paddle pairs, or 2) fixed in length to merely provide support. Likewise, the center truss can be 1) a fixed size to merely provide support or 2) adjustable in length to affect the roll axis leveling and angle of the paddle pairs. The adjustable turnbuckle arms and/or adjustable width center truss can be used as fine adjustments in the roll axis with respect to each other and the nuts.

Referring back to FIG. 15, the leveling adjustment mechanism for the curved bracket works in a similar manner. The mating of the center truss to the curved brackets is controlled by the leveling adjustment mechanism to affect the tilt axis angle and leveling across each of the paddle with respect to the other paddle in the paddle pair. The leveling adjustment mechanism located at the mating of the center truss and curved brackets may be a combination of any of adjustment of opposing jack screw or jack nuts, use of a set of predrilled holes, use of a slotted hole/slip joint, a fixed hole and a nut and bolt, all types of nuts including large wing nut, clamps, and deformation components, all applying forces to change the tilt angle on the surface of the paddles with respect to each other. The use of hardened fine threaded bolts in various such as opposing jack screws, threaded nuts or threaded holes in the frame or brackets and similar mechanisms allows a high level of torque to be applied in very accurate manner to make small accurate angular changes in the surface of the paddle. In an embodiment, the adjustment of the nuts on this center truss 522 may level the paddle pair in the vertical axis (i.e., make the paddles co-planar). Many other adjustment mechanisms can be designed into the coupling of the truss 522 to curved brackets 524, 526 but the adjustment mechanism is designed into this coupling of the two. This folding structure consists of the center truss 522, two curved brackets 524, 526 on their hinges connected to the paddle frame, and the two turnbuckle arms connected to the paddle frame on each paddle, and couples to its own linear actuator, which is used controlling paddle tilt articulation. In an embodiment, after the center truss 522 is installed, then the paddle pair may be aligned and then finally the linear actuator can be coupled to the center truss 522 of the folding structure. The opposing bolts on the center truss 522 can be used as fine adjustments in the tilt axis with respect to each other until the readings are the essentially the same, indicating that the CPV Modules are in the same plane (or parallel planes). Note, after alignment, under the paddle, the locknuts located on both sides of the turnbuckle arm should be locked down to prevent further turning. A back and forth fine adjustment can be made between the turnbuckle arms and level adjustment mechanism, and then a locking mechanism can be applied to these fine adjustment mechanisms once the alignment in three dimensions is set for the paddle pair. After the alignment is set, re-verify the alignment and then store the angle reading noted on the digital levels (variation from zero degrees) for this pair in computer memory in the local electronic housing for this two axis tracker mechanism.

Installing the Center Truss Between the Curved Brackets

In an embodiment, the center truss is installed between the curved brackets by rotating both paddles to an orientation about 30 degrees from vertical and approximately parallel to each other with the glass sides facing south. Place the center truss between the two truss mounting sites located on the curve bars with the center truss clevis bracket facing upward. Remove the nuts from the curve arm brackets on both curve arms and insert the bolts into the corresponding holes on the center truss. Replace the nuts, hand tight, on both sides. The paddle pair is now coupled together. The adjustment of the nuts on this center truss may level the paddle pair in the vertical axis (i.e., make the paddles co-planar). This folding structure consisting of the center truss, two curved bars on their hinges connected to the paddle frame, and the two turnbuckle arms connected to the paddle frame on each paddle couples to its own linear actuator, which is used controlling paddle tilt articulation. In an embodiment, after the folding structure's center truss is installed, then the paddle pair may be aligned and then finally the linear actuator can be coupled to the center truss of the folding structure. A set of CPV solar cells is formed per tilt axle. The sets of CPV solar cells are installed in paddle assemblies onto the multiple independently moveable tilt axles of the tracking mechanism. Two or more paddle structures are joined in a paddle assembly per tilt axle of the tracking mechanism.

Referring back to FIG. 3, the two-axis tracker mechanism for the concentrated photovoltaic has multiple paddle structures that contain the CPV solar cells. A paddle 728 is constructed such that its set of CPV cells contained in the paddle maintain their alignment in three dimensions when installed in the paddle 728. Each paddle structure 728 has a skeleton frame that contains multiple individual CPV cells arranged in a grid like pattern that are pre-aligned in the three dimensions with each other during the fabrication process when the concentrated photovoltaic cells are installed in the paddle. Many CPV solar cells may be contained in each rectangular housing module, such as a first CPV module. Each paddle structure 728 also has a centerline-aligned tube 732 connected to the skeleton framing. The paddle structure 728 has a bow shaped frame structure and the central tube 732 for sliding the paddles onto the tilt axle. The top and bottom portions of the bow shaped frame structure have their sides and end corners mated, such as welded together. Each metal beam support section of the bow frame has a centered bracket to allow the central tube 732 to be installed along the centerline and welded in place prior to shipping the paddle to the field. The CPV module mounting brackets welded onto the paddle frame, generally connect into two or more discrete CPV modules. This overall structure of the paddle maintains the three dimensional alignment of the installed CPV cells during shipment as well as during an operation of the two-axis tracker mechanism. An example two-axis tracker unit may have twenty-four CPV solar cells per module, eight modules per paddle, two or more paddles per paddle assembly, and a paddle assembly per tilt axis. Note, the tilt axial may have a shape such as a rectangle or hexagon to ensure the proper assembly of the paddle onto the tilt axle. The paddle central tube would correspondingly be rectangular or hexagonal as well.

In an embodiment, each CPV module assembly may be created with a rectangular grid containing, for example, twenty-four individual concentrated photovoltaic cells, each CPV cell in its own solar receiver. The CPV power units with the solar cells may optically couple with Fresnel Lenses aligned during the manufacturing process. The modules that have been fabricated to have the CPV receivers installed aligned vertically, horizontally, with respect to the other receivers installed in the module template. Thus, the CPV cells in an individual module are aligned in three dimensions with each other by the fabrication process, and use keyed parts shaped or pinned to fit together in only one way so that all of the solar receivers containing the CPV cells maintain their alignment when installed in a CPV module. The paddle structure then maintains the alignment of the installed modules during shipment and during the operation of the solar arrays.

Each paddle structure houses multiple CPV modules. The concentrating photovoltaic system includes rows and columns of photovoltaic cells packaged in the form of a module. The solar arrays in the form of paddle may, for example, be eight module assemblies integrated together to make a rectangular grid, in which each module contains a fixed number of individual concentrated photovoltaic cells, such as twenty four. The smaller two Kilowatt modules, housed in a paddle format, are easier to fabricate, assemble, and maintain component parts. The small two Kilowatt modules balance factors including thermal requirements for each power generating unit (receiver assembly), cost of manufacture, power density across the surface of the power array, cost of shipping, and cost of installation to determine the size and amount of component parts.

Thus, multiple CPV rectangular shaped modules, such as eight, are housed in each paddle structure. Each CPV solar cell is housed in a receiver assemble. Multiple receiver assemblies are installed in an evenly spaced grid pattern of columns and rows into each CPV module, such as twenty four receiver assemblies per module, and occupy the horizontal surface area of the module.

The CPV power units collect and concentrate the sunlight. However, by having multiple paddles forming the solar array of the two-axis tracker, the surface area of densely populated CPV cells is broken up into pairs of paddles compared to a single larger unitary array, which allows for easier shipping and easier installation.

Figure 17:
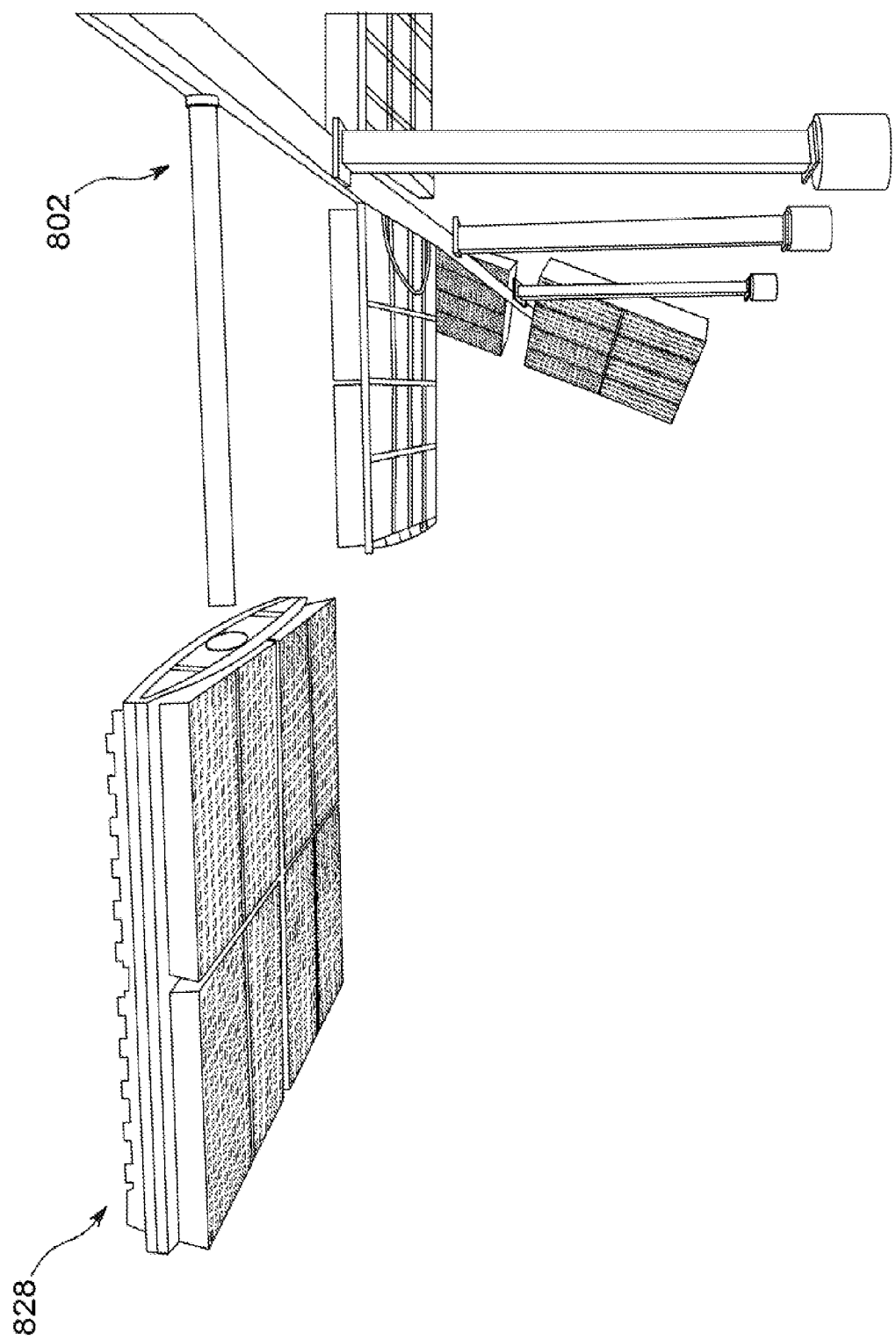
FIG. 17 illustrates a diagram of an embodiment of a paddle with its CPV cells installed and a central support tube of the paddle aligning to easily slide onto the tilt axle when being installed in the field.

FIG. 17 illustrates a diagram of an embodiment of a paddle with its CPV cells installed and the central support tube of the paddle aligning to easily slide onto the tilt axle when being installed in the field. Assembly of the parts in the field of the two-axis tracker assembly is made easy by many design features including sliding the paddle structure 828 onto a section of tilt axle, and coupling the sections of the common roll axle 802 together at manufactured-in aligned connection points of the slew drive motor and roll bearings.

As discussed, each paddle structure 828 has a centerline-aligned tube that slides onto its tilt axle. Each tilt axle assembly is designed for easy sliding on each paddle onto the tilt axle. Two or more tilt axles couple to the common roll axle 802 and each side of the tilt axle has a paddle structure 828 slid and secured onto that tilt axle. The tilt axle couples to the wider conical portion of a section of roll axle 802.

Thus, the solar array support structure may have couplings for easy installation of the paddle 828; and correspondingly, the paddle's design itself is configured for easy installation sliding of the paddle 828 onto the tilt axle of the support structure mounted in concrete post. The manufactured and assembled paddle 828 with its CPV modules assemblies already installed and aligned when arriving on the solar generation site assists in making the installation easier and faster. Also, the tracker assembly itself consisting of small number of unique components, such as eight main distinct types of components, results in a fewer number of steps/operations to install the arrays and paddle. The lead-in features on the central tube help to align parts and prevent damage. Note, the cylindrical center support tube of the paddle is made of a thin walled diameter material compared to the cylindrical tilt axis arm. Most of the torque of moving the paddle during operation will occur on the tilt axle rather than on the central support tube, which is designed for coupling to the tilt axle.

An example process for assembling and installing the paddles with their already installed and aligned CPV cells may be as follows. Overall, the steps can be simply to lift a paddle out of the shipping packaging, turn the paddle horizontal, slide the paddle onto the tilt axle, secure the install of the paddle to the tilt axle occur with a compression ring, and verify the alignment of the paddles. When finished installing and securing a paddle on each side of the tilt axle, use, for example, ropes on the two roll beam-side corners to tie the second paddle into the same orientation as the first paddle. Verify the two paddles on the tracker are leveled with respect to each other. This tilt axle (paddle to paddle) alignment/clocking can 1) use a digital level in the field or 2) attach a bracket on each paddle and insert a bolt between the two to level the two paddles. Note, the physical alignment of the paddles may also use keyed parts shaped or pinned to fit so that the paddles, which were all verified to be level in the various dimensions in the manufacturing facility maintain this alignment, and then made level in the field with small adjustments. When all four paddle pairs have been assembled and adjusted to be level in the various dimensions with each other, then the mechanical assembly of the solar array is complete.

In an embodiment, the alignment of the paddle pair is as follows. Pull the paddle pair into a nearly vertical position. The spider center truss will contact the roll beam when the paddles are nearly vertical. Place a digital level vertically against one of the paddle modules, contacting the top and bottom metal rim of the module (not the glass surface). Call out the reading, which should be close to (but not necessarily) 90.0 degrees. Holding the paddles in place, apply the digital level to the other paddle and note the reading. If the two readings are different, loosen the bolts on the spider center truss while applying pressure on the two paddles to bring them to the same reading to within +/−0.1 degree. When they are parallel, tighten all four bolts on the spider center truss and torque them.

Next, rotate the paddle pair to a horizontal position (parallel with the roll beams) with the glass facing upward. Place the digital levels on the glass face of the module nearest the roll beam and farthest south on both sides of the roll beam (2 digital levels). Note the readings of the two levels, which should be close to (but not necessarily) zero degrees. If they are different, indicating that the tilt axle is bowing or spooning, then expand or contract the turnbuckle arm until the readings are the same, indicating that the modules are in the same plane (or parallel planes). Rotating the turnbuckle arm in one direction causes it to expand in length, and the other direction causes it to contract. Once the readings are zero degrees, turn the lock nuts located on both sides of the turnbuckle arm to lock the center section and prevent further turning. Write down the angle reading noted on the digital levels (variation from zero degrees) for this pair.

Referring to FIG. 5, a cam follower may also be used to allow alignment of a first paddle pair on the two-axis tracker mechanism in respect to the roll axis to a second paddle pair installed on the same two-axis tracker. Optionally, all four paddle pairs on the tracker assembly can be aligned with respect to each other aligned in the 3 dimensions.

Step 6: Optionally, Aiming the Laser(s) Through the Fully Assembled Two-Axis Tracker Mechanism with the Paddles Installed and Aligned to Recheck and Verify the Alignment of the Two-Axis Tracker Mechanism.

Once the end caps of each roll bearing are removed, a continuous beam of light may be aimed through the hollow cavity running through the common roll axle and the slew drive. The two-axis tracker mechanism with the paddles installed should be aligned in the three dimensions. However, some settling of the two axis tracker mechanism may have occurred or other cause of misalignment of the mechanism during its assembly. The adjustments on the roll bearings and stanchions could be unlocked and then adjusted as need be to re-align and set the alignment of this two axis tracker mechanism.

Step 7: Optionally, Creating Virtual Coordinates for the Drive Mechanisms Moving the Physically Aligned CPV Solar Cells Occurs.

Optionally, each paddle pair may be verified as level/coplanar in all three dimensions with respect to each other and then the reading off a set of magnetic reed switches in both the roll and tilt axes may be stored in memory to create a virtual level for both axes with respect to the other paddles on that array. In either case, the physically level paddles in all three dimensions, which have been verified as level, are then used to set virtual level coordinates for the actuators and motors turning the CPV paddles.

The reed switch contact portion is installed at a known fixed location on the stationary casing of the slew drive at the manufacturing facility to speed up installation in the field. The magnetic portion of the reed switch is installed at a known fixed location on the rotating portion that couples to the common roll axle at the manufacturing facility to speed up installation in the field.

The reed switch contact portion is installed at a known fixed location on the stationary casing of the slew drive. The magnetic portion of the reed switch is installed at a known fixed location on the rotating portion that couples to the common roll axle. Thus, a set of, for example, five magnetic reed switches are used to provide reference positions of the paddles during operation. This set of magnetic reed sensors, one at each measured axis, is used to determine 1) a reference position for the tilt linear actuators to control the tilt axis of the CPV cells as well as 2) a reference position for the slew drive motor 210 to control the roll axis of the CPV cells. A total of, for example, four magnetic reed switches are used on the bottoms of the four paddle pairs to indicate a tilt axis angle of 0, 0 for the linear actuators, and one magnetic reed switch is used on the slew drive motor to indicate a roll axis angle of 0, 0 for the slew drive. These magnetic reed sensors are located and configured to allow a degree of rotation on the roll axis of the solar tracker to be accurately correlatable to a number of rotations of the slew drive motor. Similarly, the magnetic reed sensors for the tilt axis are located and configured to allow a position along each linear actuator to be accurately correlatable to a degree of rotation on the tilt axis of the solar tracker.

Note, when each paddle pair is aligned as described above, the roll angle of each pair and tilt angle of each pair should have been written down and put into a memory in the electronics housing. Ideally, all measurements will be the same—close to, but not necessarily, zero degrees. A virtual offset is created between the known and verified physically horizontally level paddle pairs and where the reed switches indicate that the slew drive motor is at coordinates 0, 0 as well as when the known and verified physically vertically level paddle pair are at level and the linear actuator is at coordinates 0, 90.

The motor control circuits in the integrated electronics housing may include controls for and parameters on the slew drive, tilt linear actuators, and the above reference reed switches. Also, the integrated electronics housing may contain the inverter AC generation circuits. The housing may also contain the local code employed for the Sun tracking algorithms for each paddle assembly.

Although the foregoing embodiments have been described in some detail for purposes of clarity of understanding, the invention is not limited to the details provided. The Solar array may be organized into one or more paddle pairs. A flange may be replaced with couplings and similar connectors. The roll axle may be conical or some other shape. The two-axis tracker assembly may be a multiple axis tracker assembly in three or more axes. The disclosed embodiments are illustrative and not restrictive.

We claim:

1. A two-axis tracking mechanism for a concentrated photovoltaic system provided in modular sections configured to assemble easily in the field and maintain alignment of the tracking mechanism, comprising:
   a common roll axle comprising multiple, connected roll axle segments;

a paddle assembly comprising:
- a plurality of paddle structures, the paddle assembly being supported by and rotatable with a roll axle segment of the multiple, connected roll axle segments, the paddle assembly being further rotatable with a tilt axle perpendicular to the common roll axle, each paddle structure of the plurality of paddle structures supporting at least one concentrated photovoltaic (CPV) solar module;
- a hinged curved bracket rotatably connected to each paddle structure of the paddle assembly, each hinged curved bracket comprising alignment connection elements configured to position the paddle structures relative to one another on opposing sides of the common roll axle and to couple the paddle structures to one another across the common roll axle on the tilt axle;
- a center truss extending between and connected to an alignment connection element of each hinged curved bracket; and
- a turnbuckle arm connected to another alignment connection element of each hinged curved bracket and extending from each hinged curved bracket to a periphery of the paddle structure.

2. The two-axis tracking mechanism of claim 1, further comprising a plurality of paddle assemblies, each paddle assembly being supported by and rotatable with a separate roll axle segment, wherein the common roll axle rotates each paddle assembly about a roll axis of the roll axle, and each paddle assembly is rotated by a separate linear actuator about a tilt axis of a respective tilt axle.

3. The two-axis tracking mechanism of claim 1, wherein two or more of the roll axle segments are connected to a slew drive motor, each roll axle segment is conical in shape, and each roll axle segment not connected to the slew drive motor is connected to one or more roll bearings, a narrower end of each conical roll axle segment comprising a flanged indexed connection plate, and each roll bearing comprising a rotatable spindle comprising matching alignment pinholes for aligning a roll axis defined by the common roll axle of the two-axis tracking mechanism.

4. The two-axis tracking mechanism of claim 1, wherein each roll axle segment is coupled at ends of each roll axle segment by a spindle inside a roll bearing, a mating connection of a slew drive motor, one or more roll bearings, or any combination of these to form the common roll axle for the two-axis tracker mechanism, and each adjacent pair of roll axle segments is supported by at least a common stanchion between the adjacent pair of roll axle segments.

5. The two-axis tracking mechanism of claim 1, wherein each roll axle segment exhibits a conic shape at each end of each roll axle segment, a wider, middle portion of each roll axle segment being connected to an associated paddle assembly proximate the tilt axle to facilitate rotation of the paddle assembly, and narrower, end portions of each roll axle segment is used to couple to a roll bearing, a spindle, a slew drive, or any combination of these components.

6. The two-axis tracking mechanism of claim 1, wherein each hinged curved bracket is configured to rotate flush against its associated paddle structure when the paddle structure is shipped to facilitate easy maneuverability when assembling the paddle assembly in the field and the center truss is connected to a linear actuator affixed to an associated roll axle segment to rotate the paddle assembly on the tilt axle.

7. The two-axis tracking mechanism of claim 6, wherein the center truss comprises a fixed set of holes to connect the center truss to the linear actuator, and a mounting bracket configured to support the linear actuator is located on each roll axle section in a fixed spot to correlate the length of travel for each linear actuator to an exact position of the paddle assembly on the two-axis tracking mechanism.

8. The two-axis tracking mechanism of claim 1, further comprising a slew drive with a hole in the center for alignment, a worm gear connected to the slew drive, a separate gear box connected to the worm gear and the slew drive, and a keyed flange connection to mate with one or more roll axle segments of the common roll axle, and wherein the slew drive comprises at least one handle on top to lift up the slew drive and a bottom configured to fit on top of a stanchion in a predetermined orientation.

9. The two-axis tracking mechanism of claim 1, wherein a first paddle structure of the paddle assembly comprises a bow shaped frame structure and a central tube for sliding the paddle structure onto the tilt axle, and wherein the paddle structure maintains a three dimensional alignment of the at least one CPV module during shipment as well as during operation of the two-axis tracker mechanism.

10. The two-axis tracking mechanism of claim 1, wherein the paddle assembly is symmetrical about the tilt axis and the roll axis to balance wind loads.

11. The two-axis tracking mechanism of claim 1, wherein a support structure of the two-axis tracking mechanism axially constrains the common roll axle as the common roll axle rotates, and the support structure includes two or more roll bearings, which each have offset grooves located inside a housing of that roll bearing, the offset grooves holding ultra-high-molecular-weight plastic bearings in place axially and rotationally.

12. The two-axis tracking mechanism of claim 1, wherein two or more roll axle segments of the common roll axle couple to roll bearings mounted on top of stanchions and the roll bearings each have a three axis adjustment mechanism to level each of the roll bearings with respect to one another.

13. The two-axis tracking mechanism of claim 12, wherein mating surfaces of the roll bearings and a slew drive are shaped and pinned to couple with the roll axle segments when the roll axle segments are in a predetermined orientation.

14. The two-axis tracking mechanism of claim of 1, wherein a first roll axle segment includes a flange comprising a mating pattern that matches a pinned mating pattern of a flange of a spindle rotatably supported within a first roll bearing, the spindle comprising a metal material coated with a corrosion- and wear-resistant material exhibiting a low co-efficient of friction, the corrosion- and wear-resistant material exhibiting a thickness configured to endure expected lifetime wear in the two-axis tracking mechanism.

15. The two-axis tracking mechanism of claim 1, wherein a tilt hub is located at an intersection of the common roll axle and a first tilt axle, a roll axle segment to which the tilt hub is attached exhibiting a narrowing taper from a center of the roll axle segment toward axial ends of the roll axle segment, the tilt hub comprising a bolted connection to a wider portion of the roll axle segment, an associated tilt axle being inserted into the tilt hub, a housing of the tilt hub comprising multiple cavities, and a set of stanchions supporting the two axis tracking mechanism, wherein a first stanchion comprises two or more segments including a concrete pillar portion with a capped bolt pattern portion above ground and a portion buried into the ground, and a metal post section, and wherein a mating coupler between the concrete pillar and metal section comprises an adjustment mechanism configured to adjust orientation of the metal section within the three dimensions.

16. A multiple-axis solar tracking apparatus, comprising:

a multiple-axis tracking mechanism for a concentrated photovoltaic (CPV) system, the multiple-axis tracking mechanism comprising paddle assemblies, each paddle assembly being rotatable with at least a common roll axle comprising multiple, connected roll axle segments and a respective tilt axle, an axis of rotation of the common roll axle being perpendicular to an axis of rotation of each tilt axle, each paddle assembly comprising:
  a plurality of paddle assemblies comprising two or more paddle structures supporting one or more CPV modules, each paddle assembly being supported by and rotatable with a roll axle segment of the multiple, connected roll axle segments, each paddle assembly being further rotatable with a tilt axle perpendicular to the common roll axle;
  a hinted curved bracket rotatably connected to each addle structure of the paddle assembly, each hinged curved bracket comprising alignment connection elements configured to position the paddle structures relative to one another on opposing sides of the common roll axle and to couple the paddle structures to one another across the common roll axle on the tilt axle;
  a center truss extending between and connected to an alignment connection element of each hinged curved bracket; and
  a turnbuckle arm connected to another alignment connection element of each hinged curved bracket and extending from each hinged curved bracket to a periphery of the paddle structure; and
stanchions supporting the common roll axle, each stanchion including a slew drive motor configured to rotate the common roll axle attached to the common roll axle or a roll bearing configured to transmit rotational force attached to the common roll axle, at least one slew drive motor or roll bearing comprising an alignment laser directed along the roll axis, each other slew drive motor and roll bearing comprising an alignment hole through which the laser shines when activated.

17. A method of assembling a two-axis tracking mechanism for a concentrated photovoltaic (CPV) system provided in modular sections configured to assemble easily in the field and maintain alignment of the tracking mechanism, comprising:
  assembling a common roll axle comprising multiple, connected roll axle segments;
  installing a paddle assembly comprising a plurality of paddle structures, the paddle assembly being supported by and rotatable with a roll axle segment of the multiple, connected roll axle segments, the paddle assembly being rotatable with a tilt axle perpendicular to the common roll axle, each paddle structure of the plurality of paddle structures supporting at least one CPV module; and
  reinforcing the paddle assembly by:
    extending a hinged curved bracket on each paddle structure of the paddle assembly;
    connecting each hinged curved bracket to another hinged curved bracket of the paddle assembly using a center truss extending between and connected to an alignment connection element of a plurality of alignment connection elements of each hinged curved bracket configured to position the paddle structures relative to one another on opposing sides of the common roll axle and to couple the paddle structures to one another across the common roll axle on the tilt axle; and
    connecting each hinged curved bracket to a periphery of its associated paddle structure using a turnbuckle arm connected to another alignment connection element of each hinged curved bracket and extending from each hinged curved bracket to a periphery of the paddle structure.

18. The method of claim 17, further comprising installing a plurality of paddle assemblies, each paddle assembly being supported by and rotatable with a separate roll axle segment, and rotating each paddle assembly on a given tilt axle by its own linear actuator per tilt axle along a tilt axis; and rotating all paddle assemblies connected to the common roll axle couple using a slew drive motor.

* * * * *

UNITED STATES PATENT AND TRADEMARK OFFICE
CERTIFICATE OF CORRECTION

Page 1 of 1

PATENT NO. : 8,835,747 B2
APPLICATION NO. : 13/227664
DATED : September 16, 2014
INVENTOR(S) : Wayne Miller et al.

It is certified that error appears in the above-identified patent and that said Letters Patent is hereby corrected as shown below:

In the specification:
COLUMN 2, LINE 35, change "of the conical" to --of a conical--

In the claims:
CLAIM 14, COLUMN 22, LINE 42, change "of claim of 1," to --of claim 1,--
CLAIM 16, COLUMN 23, LINE 16, change "a hinted" to --a hinged--
CLAIM 16, COLUMN 23, LINE 17, change "addle structure" to --paddle structure--

Signed and Sealed this
Twenty-ninth Day of December, 2015

Michelle K. Lee
*Director of the United States Patent and Trademark Office*